(12) United States Patent
Kyono et al.

(10) Patent No.: US 7,949,026 B2
(45) Date of Patent: May 24, 2011

(54) GROUP III NITRIDE SEMICONDUCTOR LASER

(75) Inventors: Takashi Kyono, Itami (JP); Katsushi Akita, Itami (JP); Yusuke Yoshizumi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/600,300

(22) PCT Filed: Feb. 17, 2009

(86) PCT No.: PCT/JP2009/052681
§ 371 (c)(1),
(2), (4) Date: Nov. 16, 2009

(87) PCT Pub. No.: WO2009/107516
PCT Pub. Date: Sep. 3, 2009

(65) Prior Publication Data
US 2010/0189148 A1     Jul. 29, 2010

(30) Foreign Application Priority Data
Feb. 25, 2008 (JP) .................................. 2008-043398

(51) Int. Cl.
*H01S 5/00* (2006.01)
(52) U.S. Cl. .................. 372/43.01; 372/45.01; 372/39
(58) Field of Classification Search ............. 372/39, 372/43.01, 45.01
See application file for complete search history.

(56) References Cited

U.S. PATENT DOCUMENTS

| | | | | |
|---|---|---|---|---|
| 5,959,307 | A | * | 9/1999 | Nakamura et al. .............. 257/14 |
| 6,434,178 | B1 | * | 8/2002 | Ubukata ................... 372/45.011 |

(Continued)

FOREIGN PATENT DOCUMENTS

JP          7-170022 A         7/1995

(Continued)

OTHER PUBLICATIONS

Keller et al., "Growth and characterization of bulk InGaN films and quantum wells" Appl. Phys. Lett., vol. 68, No. 22, pp. 3147-3149 (1996).

(Continued)

*Primary Examiner* — Minsun Harvey
*Assistant Examiner* — Phillip Nguyen
(74) *Attorney, Agent, or Firm* — Venable LLP; Michael A. Sartori; Steven J. Schwarz

(57) ABSTRACT

A group III nitride semiconductor laser is provided that has a good optical confinement property and includes an InGaN well layer having good crystal quality.
An active layer 19 is provided between a first optical guiding layer 21 and a second optical guiding layer 23. The active layer 19 can include well layers 27a, 27b, and 27c and further includes at least one first barrier layer 29a provided between the well layers. The first and second optical guiding layers 21 and 23 respectively include first and second InGaN regions 21a and 23a smaller than the band gap $E_{29}$ of the first barrier layer 29a, and hence the average refractive index $n_{GUIDE}$ of the first and second optical guiding layers 21 and 23 can be made larger than the refractive index $n_{29}$ of the first barrier layer 29a. Thus, good optical confinement is achieved. The band gap $E_{29}$ of the first barrier layer 29a is larger than the band gaps $E_{21}$ and $E_{23}$ of the first and second InGaN regions 21a and 23a.

20 Claims, 12 Drawing Sheets

U.S. PATENT DOCUMENTS

| | | | |
|---|---|---|---|
| 6,586,762 B2 * | 7/2003 | Kozaki | 257/14 |
| 6,838,693 B2 * | 1/2005 | Kozaki | 257/14 |
| 7,166,869 B2 * | 1/2007 | Nakamura et al. | 257/85 |
| 2003/0015724 A1 * | 1/2003 | Nakamura et al. | 257/103 |
| 2004/0051107 A1 * | 3/2004 | Nagahama et al. | 257/79 |
| 2004/0101012 A1 * | 5/2004 | Nakamura et al. | 372/46 |
| 2006/0126688 A1 | 6/2006 | Kneissl | |
| 2006/0131604 A1 * | 6/2006 | Kozaki | 257/103 |

FOREIGN PATENT DOCUMENTS

| | | |
|---|---|---|
| JP | 09-266327 | 10/1997 |
| JP | 2000-236142 | 8/2000 |
| JP | 2000-286448 | 10/2000 |
| JP | 2003-332697 | 11/2003 |
| JP | 2006-173621 | 6/2006 |

OTHER PUBLICATIONS

Okamoto et al., "Pure blue laser diodes based on nonpolar *m*-plane gallium nitride with InGaN waveguiding layers", Japanese Journal of Applied Physics, JJAP Express Letter, vol. 46, No. 35, pp. L820-L822 (2007).

* cited by examiner

GROUP III NITRIDE SEMICONDUCTOR LASER

TECHNICAL FIELD

The present invention relates to a group III nitride semiconductor laser.

BACKGROUND ART

Non-Patent Document 1 describes a blue laser diode formed on a nonpolar m-plane gallium nitride substrate. The lasing wavelength is 451.8 nm and the threshold current is 134 mA. The laser diode includes an InGaN quantum well structure, a p-type GaN or InGaN optical guiding layer, an n-type GaN or InGaN optical guiding layer, and an Al-containing cladding layer.

Patent Document 1 describes an AlGaInN-based edge emitting semiconductor laser device. The semiconductor laser device is fabricated on a sapphire substrate. A GaInN-ELO structure layer is formed on the sapphire substrate and a stacked layer structure is grown on the structure layer by MOCVD. The stacked layer structure is constituted by an n-GaInN contact layer, an n-AlGaInN cladding layer, an n-GaN optical guiding layer, a GaInN active layer, a p-GaN optical guiding layer, a p-(GaN:Mg/AlGaInN) cladding layer, and a p-GaInN contact layer.

Patent Document 2 describes a light-emitting device employing a sapphire substrate. The light-emitting device includes a first intermediate layer composed of $In_{0.08}Ga_{0.92}N$, a second intermediate layer composed of $In_{0.15}Ga_{0.85}N$, and a light-emitting layer composed of $In_{0.20}Ga_{0.80}N$.

Patent Document 3 describes a group III nitride-based compound semiconductor light-emitting device. This light-emitting device includes an $In_{0.03}Ga_{0.97}N$ intermediate layer, an n-type cladding layer, and a light-emitting layer. The n-type cladding layer is positioned between the intermediate layer and the light-emitting layer. The light-emitting layer includes a GaN barrier layer and an $In_{0.20}Ga_{0.80}N$ well layer.

[Non-Patent Document 1] JJAP, vol. 46, No. 35, 2007, p. L820-L822
[Patent Document 1] Japanese Unexamined Patent Application Publication No. 2003-332697
[Patent Document 2] Japanese Unexamined Patent Application Publication No. 9-266327
[Patent Document 3] Japanese Unexamined Patent Application Publication No. 2000-286448

DISCLOSURE OF INVENTION

Problems to be Solved by the Invention

The light-emitting device of Patent Document 1 includes GaN optical guiding layers. The light-emitting devices of Patent Documents 2 and 3 do not include a optical guiding layer. In Non-Patent Document 1, a semiconductor laser having a lasing wavelength of 450 nm is fabricated on an m-plane GaN substrate. When an active layer is formed so as to obtain a longer lasing wavelength, the difference in refractive index between a cladding layer and a guiding layer becomes small. To avoid this, an InGaN guiding layer is used instead of a GaN guiding layer. Thus, an optical confinement property is enhanced. In Patent Document 1, InGaN well layers and InGaN barrier layers are used and optical guiding layers are composed of GaN.

Use of InGaN optical guiding layers instead of GaN optical guiding layers can provide higher refractive indices of an active layer and neighboring optical guiding layers than the refractive indices of cladding layers. Thus, an optical confinement property is enhanced.

However, many InGaN layers having In compositions of several percent are grown between an n-type cladding layer and a p-type cladding layer. The growth temperature of InGaN is lower than the growth temperatures of GaN and AlGaN. For this reason, there is a high probability of three-dimensional growth in the growth of InGaN compared with the growth of GaN and AlGaN. In the growth of InGaN to a large thickness, the larger the thickness is, the poorer the crystal quality becomes. An InGaN layer having a higher composition of indium is required to be grown at a lower growth temperature. Low growth temperature results in poor InGaN crystal quality. Thus, InGaN well layers have poor crystal quality.

The present invention has been accomplished under these circumstances and an object of the present invention is to provide a group III nitride semiconductor laser that has a good optical confinement property and includes an InGaN well layer having good crystal quality.

Means for Solving the Problems

A group III nitride semiconductor laser according to an aspect of the present invention includes: (a) a substrate having a main surface; (b) an n-type cladding layer provided on the substrate and composed of a group III nitride semiconductor; (c) a p-type cladding layer provided on the substrate and composed of a group III nitride semiconductor; (d) an active layer provided between the n-type cladding layer and the p-type cladding layer; (e) a first optical guiding layer provided between the n-type cladding layer and the active layer; and (f) a second optical guiding layer provided between the p-type cladding layer and the active layer. The active layer includes a plurality of well layers and at least one first barrier layer provided between the well layers; the first optical guiding layer includes a first InGaN region composed of InGaN that has a band gap smaller than a band gap of the first barrier layer and larger than a band gap of the well layers; the second optical guiding layer includes a second InGaN region that is composed of InGaN; among the well layers of the active layer, a well layer that is closest to the first optical guiding layer is a first well layer; among the well layers of the active layer, a well layer that is closest to the second optical guiding layer is a second well layer; and the active layer includes a second barrier layer provided between the first well layer and the first optical guiding layer, and a third barrier layer provided between the second well layer and the second optical guiding layer.

In this group III nitride semiconductor laser, since the first optical guiding layer includes the first InGaN region smaller in band gap than the first barrier layer, the average refractive index of the first optical guiding layer can be made larger than the refractive index of the first barrier layer. Thus, good optical confinement is achieved. The band gap of the first barrier layer is larger than the band gap of the first InGaN region. For this reason, the growth temperature of the first barrier layer can be made higher than the growth temperature of the first optical guiding layer, and hence the first barrier layer can be made to have good crystal quality. Thus, the well layer on the first barrier layer has good crystal quality.

In a group III nitride semiconductor laser according to the present invention, the second InGaN region preferably has a band gap smaller than the band gap of the first barrier layer and larger than the band gap of the first and second well layers. In this group III nitride semiconductor laser, since the second optical guiding layer includes the second InGaN region smaller in band gap than the first barrier layer, the average refractive index of the second optical guiding layer can be made larger than the refractive index of the first barrier layer. Thus, good optical confinement is achieved.

In a group III nitride semiconductor laser according to the present invention, the second barrier layer may include a portion having a band gap larger than the band gap of the first InGaN region; and the third barrier layer may include a portion having a band gap larger than a band gap of the second InGaN region. In this group III nitride semiconductor laser, since the band gaps of the first to third barrier layers are larger than the band gaps of the first and second InGaN regions, the growth temperatures of the first to third barrier layers can be made higher than the growth temperatures of the first and second InGaN regions, and hence the first to third barrier layers can be made to have good crystal quality. Thus, the well layers on the first to third barrier layers have good crystal quality.

In a group III nitride semiconductor laser according to the present invention, the first barrier layer may be composed of a gallium nitride-based semiconductor, and the second and third barrier layers may be composed of the gallium nitride-based semiconductor.

In this group III nitride semiconductor laser, since the band gaps of the second and third barrier layers are the same as the band gap of the first barrier layer, the second and third barrier layers have good crystal quality. Although InGaN having a high indium composition is used for the optical guiding layers, the crystal quality can be improved in the growth of the barrier layers.

In a group III nitride semiconductor laser according to the present invention, the second optical guiding layer may further include a third InGaN region provided between the third barrier layer and the second InGaN region, and the third InGaN region may have an indium composition that increases in a direction from the third barrier layer to the second InGaN region.

In this group III nitride semiconductor laser, accumulation of holes in the second optical guiding layer can be reduced.

In a group III nitride semiconductor laser according to the present invention, the third barrier layer may include an InGaN region, and the InGaN region of the third barrier layer may have an indium composition that increases in a direction from the second well layer to the second InGaN region.

In this group III nitride semiconductor laser, the third barrier layer includes at least one portion having a composition gradient. As a result, a stepwise potential barrier against holes flowing from the second optical guiding layer to the well layers is reduced.

In a group III nitride semiconductor laser according to the present invention, the second optical guiding layer may further include a fourth InGaN region provided between the second InGaN region and the p-type cladding layer, and the fourth InGaN region may have an indium composition that decreases from the second InGaN region toward the p-type cladding layer.

In this group III nitride semiconductor laser, since the fourth InGaN region of the optical guiding layer is close to the cladding layer, a decrease in the indium composition of the fourth InGaN region results in only a small decrease in the optical confinement property. On the other hand, a decrease in the indium composition of the fourth InGaN region can reduce degradation of the crystal quality of the optical guiding layer.

In a group III nitride semiconductor laser according to the present invention, the first optical guiding layer may further include a fifth InGaN region provided between the second barrier layer and the first InGaN region, and the fifth InGaN region may have an indium composition that increases in a direction from the second barrier layer to the first InGaN region.

In this group III nitride semiconductor laser, accumulation of electrons in the first optical guiding layer can be reduced.

In a group III nitride semiconductor laser according to the present invention, the second barrier layer may include an InGaN region, and the InGaN region of the second barrier layer may have an indium composition that increases in a direction from the first well layer to the first InGaN region.

In this group III nitride semiconductor laser, the second barrier layer includes at least one portion having a composition gradient. As a result, a stepwise potential barrier against electrons flowing from the first optical guiding layer to the well layers is reduced.

In a group III nitride semiconductor laser according to the present invention, the first optical guiding layer may further include a sixth InGaN region provided between the first InGaN region and the n-type cladding layer, and the sixth InGaN region may have an indium composition that decreases in a direction from the first InGaN region to the n-type cladding layer.

In this group III nitride semiconductor laser, since the sixth InGaN region of the optical guiding layer is close to the cladding layer, a decrease in the indium composition of the sixth InGaN region results in only a small decrease in the optical confinement property. On the other hand, a decrease in the indium composition of the sixth InGaN region can reduce degradation of the crystal quality of the optical guiding layer.

In a group III nitride semiconductor laser according to the present invention, the second barrier layer includes a portion having a band gap smaller than the band gap of the first InGaN region; and the third barrier layer includes a portion having a band gap smaller than a band gap of the second InGaN region.

In this group III nitride semiconductor laser, carriers smoothly flow from the optical guiding layers to the well layers.

In a group III nitride semiconductor laser according to the present invention, the second optical guiding layer may further include a seventh InGaN region provided between the second InGaN region and the p-type cladding layer, and the seventh InGaN region may have an indium composition that decreases from the second InGaN region toward the p-type cladding layer.

In this group III nitride semiconductor laser, since the seventh InGaN region of the optical guiding layer is close to the cladding layer, a decrease in the indium composition of the seventh InGaN region results in only a small decrease in the optical confinement property. On the other hand, a decrease in the indium composition of the seventh InGaN region can reduce degradation of the crystal quality of the optical guiding layer.

In a group III nitride semiconductor laser according to the present invention, the first optical guiding layer may further include an eighth InGaN region provided between the first InGaN region and the n-type cladding layer, and the eighth InGaN region may have an indium composition that decreases in a direction from the first InGaN region to the n-type cladding layer.

In this group III nitride semiconductor laser, since the eighth InGaN region of the optical guiding layer is close to the cladding layer, a decrease in the indium composition of the eighth InGaN region results in only a small decrease in the optical confinement property. On the other hand, a decrease in the indium composition of the eighth InGaN region can reduce degradation of the crystal quality of the optical guiding layer.

In a group III nitride semiconductor laser according to the present invention, the active layer may include a multiple quantum well structure provided such that the group III nitride semiconductor laser has a light-emitting wavelength in a wavelength region of 430 nm or more.

This group III nitride semiconductor laser is suitable as a semiconductor laser for long wavelengths in which a material having a high indium composition is used for well layers.

In a group III nitride semiconductor laser according to the present invention, the first optical guiding layer may have a thickness of 150 nm or less, and the second optical guiding layer may have a thickness of 150 nm or less. According to this group III nitride semiconductor laser, when a optical guiding layer having a high indium composition has a thickness of more than 150 nm, the restoration of crystal quality in the growth of the active layer is not sufficiently achieved. As a result, the crystal quality of the active layer is degraded.

In a group III nitride semiconductor laser according to the present invention, the first InGaN region of the first optical guiding layer may have an indium composition of 0.03 or more. In this group III nitride semiconductor laser, the InGaN region having an indium composition of 0.03 or more can impart a high refractive index to the optical guiding layer. The second InGaN region of the second optical guiding layer may have an indium composition of 0.03 or more. In this group III nitride semiconductor laser, the InGaN region having an indium composition of 0.03 or more can impart a high refractive index to the optical guiding layer.

In a group III nitride semiconductor laser according to the present invention, the first optical guiding layer may have an indium composition of 0.12 or less. According to this group III nitride semiconductor laser, an InGaN region having an indium composition of more than 0.12 degrades the crystal quality of the optical guiding layer.

In a group III nitride semiconductor laser according to the present invention, the second optical guiding layer may have an indium composition of 0.12 or less. According to this group III nitride semiconductor laser, an InGaN region having an indium composition of more than 0.12 degrades the crystal quality of the optical guiding layer.

In a group III nitride semiconductor laser according to the present invention, the substrate may be composed of a group III nitride semiconductor, the main surface of the substrate may be inclined at an angle of 1° or more with respect to a c-plane of the group III nitride semiconductor, and the main surface of the substrate may be inclined at an angle of 50° or less with respect to the c-plane of the group III nitride semiconductor. According to this group III nitride semiconductor laser, such a surface inclined with respect to the c-plane is suitable for growing InGaN having a high indium composition.

In a group III nitride semiconductor laser according to the present invention, the main surface may be inclined in a direction of an a-axis of the group III nitride semiconductor. A resonator can be produced from this group III nitride semiconductor laser by m-plane cleavage.

In a group III nitride semiconductor laser according to the present invention, the substrate may be composed of GaN. According to this group III nitride semiconductor laser, a semiconductor laser can be produced with a high quality GaN wafer.

In a group III nitride semiconductor laser according to the present invention, the substrate may be composed of InGaN. According to this group III nitride semiconductor laser, the lattice mismatch between a optical guiding layer having a large indium composition and a substrate can be reduced.

A method for producing a group III nitride semiconductor laser according to the present invention includes: (a) a step of growing a first InGaN optical guiding layer on a first-conductivity-type cladding layer at a first temperature; (b) a step of growing a barrier layer after the first InGaN optical guiding layer is grown; (c) a step of growing an InGaN well layer after the barrier layer is grown; (d) a step of growing another barrier layer at a second temperature after the InGaN well layer is grown; (e) a step of growing another InGaN well layer after the another barrier layer is grown; (f) a step of growing still another barrier layer after the another InGaN well layer is grown; and (g) a step of growing a second InGaN optical guiding layer at a third temperature after the still another barrier layer is grown. The second temperature is higher than the first and third temperatures.

According to this method, since the second temperature is higher than the first and third temperatures, crystal quality is enhanced in the growth of the another barrier layer. Thus, degradation of the crystal quality of the well layer grown on this another barrier layer can be avoided.

The above-described object, another object, features, and advantages of the present invention will more readily become apparent from the following detailed description of preferred embodiments of the present invention with reference to attached drawings.

Advantages

As described above, the present invention provides a group III nitride semiconductor laser that has a good optical confinement property and includes an InGaN well layer having good crystal quality.

Figure 1:
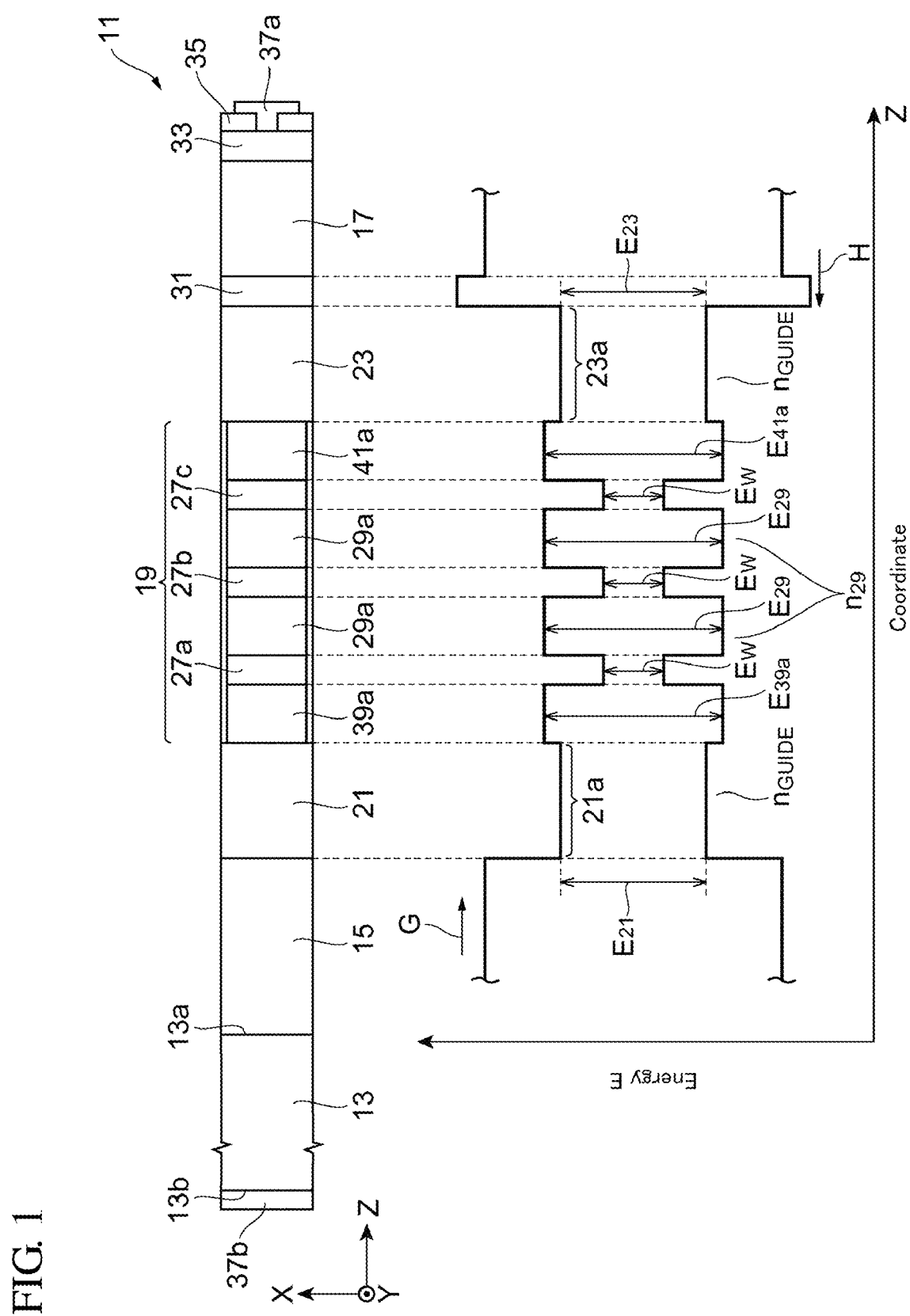
FIG. 1 is a schematic view showing the configuration of a group III nitride semiconductor laser according to an embodiment of the present invention.

REFERENCE NUMERALS 11, 11a, 11b group III nitride semiconductor lasers
13 substrate
13a main surface of substrate
13b back surface of substrate
15 n-type cladding layer
17 p-type cladding layer
19 active layer
21 first optical guiding layer
21a first InGaN region
21b fifth InGaN region
21c sixth InGaN region
23 second optical guiding layer
23a second InGaN region
23b third InGaN region
23c fourth InGaN region
27a, 27b, 27c well layers
29a first barrier layer
31 electron blocking layer
33 p-type contact layer
35 insulation film
37a, 37b electrodes
39a, 39b second barrier layers
40a first portion of second barrier layer
40b second portion of second barrier layer
41a, 41b third barrier layers
42a first portion of third barrier layer
42b second portion of third barrier layer
G electrons
H holes

BEST MODES FOR CARRYING OUT THE INVENTION

The findings of the present invention can be readily understood in consideration of the following detailed description with reference to the attached drawings serving as examples. Hereinafter, embodiments of a group III nitride semiconductor laser according to the present invention are described with reference to the attached drawings. Where possible, like reference numerals are used to denote like elements.

FIG. 1 is a schematic view showing the configuration of a group III nitride semiconductor laser according to an embodiment of the present invention. A group III nitride semiconductor laser 11 includes a substrate 13, an n-type cladding layer 15, a p-type cladding layer 17, an active layer 19, a first optical guiding layer 21, and a second optical guiding layer 23. The substrate 13 includes a main surface 13a and a back surface 13b. The substrate 13 may be composed of, for example, a gallium nitride-based semiconductor. The n-type cladding layer 15 is provided on the main surface 13a of the substrate 13 and composed of a group III nitride semiconductor. The p-type cladding layer 17 is provided on the main surface 13a of the substrate 13 and also composed of a group III nitride semiconductor. The active layer 19 is provided between the n-type cladding layer 15 and the p-type cladding layer 17. The first optical guiding layer 21 is provided between the n-type cladding layer 15 and the active layer 19. The second optical guiding layer 23 is provided between the p-type cladding layer 17 and the active layer 19. The active layer 19 is provided between the first optical guiding layer 21 and the second optical guiding layer 23. The active layer 19 can include a plurality of well layers (for example, 27a, 27b, and 27c) and also includes at least one first barrier layer 29a provided between these well layers. The first optical guiding layer 21 includes a first InGaN region 21a. The first InGaN region 21a is composed of $In_YGa_{1-Y}N$ (0<Y<1) and has a band gap $E_{21}$. The band gap $E_{21}$ is smaller than the band gap $E_{29}$ of the first barrier layer 29a and larger than the band gap $E_W$ of the well layers (for example, 27a, 27b, and 27c). The second optical guiding layer 23 includes a second InGaN region 23a. The second InGaN region 23a is composed of $In_ZGa_{1-Z}N$ (0<Z<1) and has a band gap $E_{23}$. The band gap $E_{23}$ is smaller than the band gap $E_{29}$ of the first barrier layer 29a and larger than the band gap $E_W$ of the well layers (for example, 27a, 27b, and 27c).

In the group III nitride semiconductor laser 11, the first and second optical guiding layers 21 and 23 respectively include the first and second InGaN regions 21a and 23a smaller than the band gap $E_{29}$ of the first barrier layer 29a, and hence the average refractive index $n_{GUIDE}$ of the first and second optical guiding layers 21 and 23 can be made larger than the refractive index $n_{29}$ of the first barrier layer 29a. Thus, good optical confinement is achieved. Since the band gap $E_{29}$ of the first barrier layer 29a is larger than the band gaps $E_{21}$ and $E_{23}$ of the first and second InGaN regions 21a and 23a, the growth temperature of the first barrier layer 29a can be made higher than the growth temperatures of the first and second InGaN regions 21a and 23a. Thus, the first barrier layer 29a can be made to have good crystal quality, and hence the well layer on the first barrier layer 29a has good crystal quality. The indium composition of either one of the first and second optical guiding layers 21 and 23 can be made larger than that of the first barrier layer 29a.

The n-type cladding layer 15 can be composed of, for example, AlGaN, GaN, InAlGaN, or the like. The p-type cladding layer 17 can be composed of, for example, AlGaN, GaN, InAlGaN, or the like. The barrier layer 29a can be composed of, for example, InGaN, GaN, AlGaN, or the like. The well layer 27a can be composed of, for example, InGaN. The first optical guiding layer 21 can include an undoped InGaN region. The second optical guiding layer 23 can include an undoped InGaN region. Such undoped semiconductor can reduce light absorption by carriers.

The group III nitride semiconductor laser 11 includes a p-type contact layer 33 provided on the p-type cladding layer 17. The p-type contact layer 33 is connected to an electrode 37a (for example, an anode) via an opening of an insulation film 35. When the substrate 13 is conductive, an electrode 37b (for example, a cathode) is formed on the back surface 13b of the substrate 13.

The group III nitride semiconductor laser 11 according to the present embodiment can include an electron blocking layer 31 between the optical guiding layer 23 and the p-type cladding layer 17. The electron blocking layer 31 has a band gap larger than that of the cladding layer 17. The electron blocking layer 31 can be composed of, for example, AlGaN, InAlGaN, or the like. The contact layer 33 can be composed of, for example, GaN, AlGaN, InGaN, InAlGaN, or the like.

In the group III nitride semiconductor laser 11, the first well layer 27a among the well layers (27a, 27b, and 27c) of the active layer 19 is the closest to the first optical guiding layer 21. The second well layer 27c among the well layers (27a, 27b, and 27c) of the active layer 19 is the closest to the second optical guiding layer 23. The active layer 19 includes a second barrier layer 39a and a third barrier layer 41a. The second barrier layer 39a is provided between the first well layer 27a and the first optical guiding layer 21. The third barrier layer 41a is provided between the second well layer 27c and the second optical guiding layer 23. The band gap $E_{39a}$ of the second barrier layer 39a is larger than the band gap $E_{21}$ of the first InGaN region 21a. The band gap $E_{41a}$ of the third barrier layer 41a is larger than the band gap $E_{23}$ of the second InGaN region 23a.

In the group III nitride semiconductor laser 11, since the band gaps of the first to third barrier layers 29a, 39a, and 41a are larger than the band gaps of the first and second InGaN regions 21a and 23a, the growth temperatures of the first to third barrier layers 29a, 39a, and 41a can be made higher than the growth temperatures of the first and second InGaN regions 21a and 23a. Thus, the first to third barrier layers 29a, 39a, and 41a can be made to have good crystal quality, and hence the well layers on the first to third barrier layers 29a, 39a, and 41a have good crystal quality.

Electrons G are fed from the n-type cladding layer 15 through the optical guiding layer 21 to the active layer 19. Holes H are fed from the p-type cladding layer through the optical guiding layer 23 to the active layer 19. In the active layer 19, the electrons and the holes are recombined to produce light. The produced light is confined in a waveguide region (21, 19, and 23). Since the band gaps $E_{21}$ and $E_{23}$ of the InGaN regions 21a and 23a are smaller than the band gap $E_{29}$ of the barrier layer 29a, the difference between the refractive indices of the cladding layers 15 and 17 and the refractive indices of the optical guiding layers 21 and 23 can be increased to thereby provide a desired difference between the refractive indices. Since the indium compositions of the InGaN regions 21a and 23a are high and it is not easy to maintain the InGaN regions 21a and 23a to have good crystal quality. However, the barrier layer 29a can be grown at a temperature higher than the growth temperatures for the InGaN regions 21a and 23a after the InGaN region is grown. As a result, the active layer 19 can be made to have crystal quality better than that of the InGaN regions 21a and 23a.

In the group III nitride semiconductor laser 11, the second and third barrier layers 39a and 41a may be composed of substantially the same gallium nitride-based semiconductor as in the first barrier layer 29a. Since the band gaps $E_{39a}$ and $E_{41a}$ of the second and third barrier layers 39a and 41a are equal to the band gap $E_{29}$ of the first barrier layer 29a, the second and third barrier layers 39a and 41a have good crystal quality. Although InGaN having a high indium composition is used for the optical guiding layers 21 and 23, the crystal quality can be improved in the growth of the barrier layers 29a, 39a, and 41a.

Figure 2:
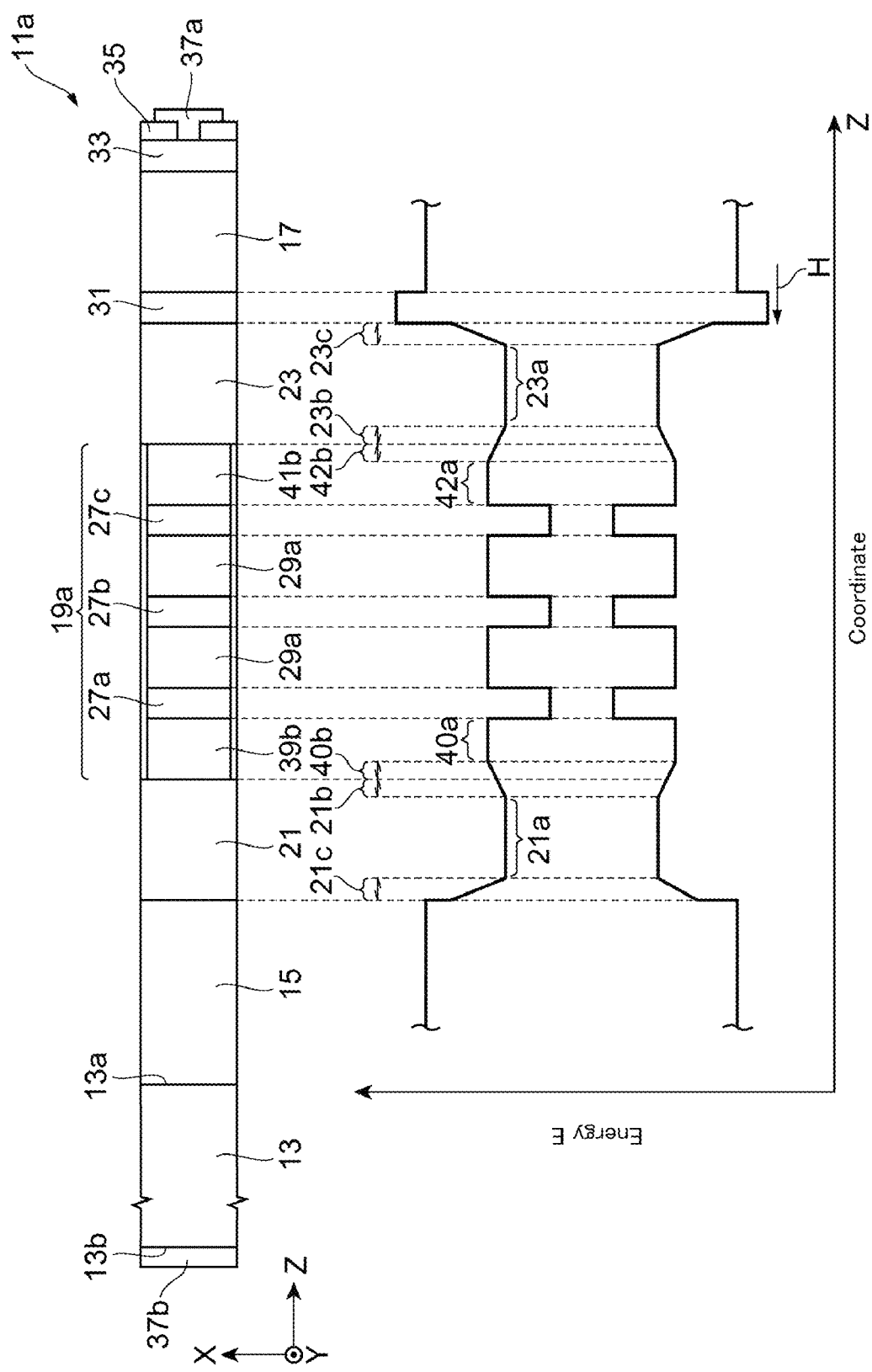
FIG. 2 is a schematic view showing the configuration of a group III nitride semiconductor laser according to another embodiment of the present invention.

FIG. 2 is a schematic view showing the configuration of a group III nitride semiconductor laser according to another embodiment of the present invention. In a group III nitride semiconductor laser 11a, an active layer 19 includes a second barrier layer 39b and a third barrier layer 41b. The second barrier layer 39b is provided between a first well layer 27a and a first optical guiding layer 21. The third barrier layer 41b is provided between a second well layer 27c and a second optical guiding layer 23.

In the group III nitride semiconductor laser 11a, the second optical guiding layer 23b includes a third InGaN region 23b. The third InGaN region 23b is provided between the third barrier layer 41b and a second InGaN region 23a. The third InGaN region 23b can be made to have an indium composition that increases in the direction from the third barrier layer 41b to the second InGaN region 23a. Holes H are fed from a p-type cladding layer 17 through the second optical guiding layer 23 to the active layer 19a. In this configuration, holes H accumulated in the second optical guiding layer 23 can be reduced. Such a decrease in the amount of carriers accumulated can enhance carrier injection efficiency and reduce absorption of light propagating through the optical waveguide.

The third barrier layer 41b can have at least one portion having a composition gradient. The third barrier layer 41b includes an InGaN region. The third barrier layer 41b includes, for example, first and second portions 42a and 42b. The first and second portions 42a and 42b are sequentially positioned in the direction from the second well layer 27c to the optical guiding layer 23. The second portion 42b may be composed of, for example, InGaN. The first portion 42a preferably includes the same barrier as in the first barrier layer 29a. The second portion 42b can be made to have an indium composition that increases in the direction from the second well layer 27c to the second InGaN region 23a. In this configuration, since the third barrier layer 41b includes at least one portion having a composition gradient, a stepwise potential barrier against holes H flowing from the optical guiding layer 23 to the well layers 27a, 27b, and 27c is reduced. The second portion 42b may be composed of InGaN having an indium composition higher than that in the first portion 42a.

If necessary, in the group III nitride semiconductor laser 11a, the second optical guiding layer 23 may include a fourth InGaN region 23c. In this case, the refractive index of the optical guiding layer can be changed in accordance with a desired far-field pattern.

In the group III nitride semiconductor laser 11a, the first optical guiding layer 21 may include a fifth InGaN region 21b. The fifth InGaN region 21b is provided between the second barrier layer 39b and the first InGaN region 21a. The fifth InGaN region 21b can be made to have an indium composition that increases in the direction from the second barrier layer 39b to the first InGaN region 21a. Electrons G are fed from the n-type cladding layer 15 through the first optical guiding layer 21 to the active layer 19a. In this configuration, electrons G accumulated in the first optical guiding layer 21 can be reduced. Such a decrease in the amount of carriers accumulated can enhance carrier injection efficiency and reduce absorption of light propagating through the optical waveguide.

In the group III nitride semiconductor laser 11a, the second barrier layer 39b can have at least one portion having a composition gradient. The second barrier layer 39b includes an InGaN region. The second barrier layer 39b includes, for example, first and second portions 40a and 40b. The first and second portions 40a and 40b are sequentially positioned in the direction from the first well layer 27a to the optical guiding layer 21. The second portion 40b may be composed of, for example, InGaN. The first portion 40a preferably includes the same barrier as in the first barrier layer 29a. The second portion 40b can be made to have an indium composition that increases in the direction from the first well layer 27a to the first InGaN region 21a. In this configuration, since the second barrier layer 39b includes at least one portion having a composition gradient, a stepwise potential barrier against electrons G flowing from the optical guiding layer 21 to the well layers 27a, 27b, and 27c is reduced. The second portion 40b may be composed of InGaN having an indium composition higher than that in the first portion 40a.

In the group III nitride semiconductor laser 11a, the first optical guiding layer 21 may include a sixth InGaN region 21c. The sixth InGaN region 21c is provided between the first InGaN region 21a and the n-type cladding layer 15. The sixth InGaN region 21c has an indium composition that decreases in the direction from the first InGaN region 21a to the n-type cladding layer 15.

In the group III nitride semiconductor laser 11a, since the sixth InGaN region 21c of the optical guiding layer 21 is close to the cladding layer 15, a decrease in the indium composition of the sixth InGaN region 21c results in only a small decrease in the optical confinement property. On the other hand, a decrease in the indium composition of the sixth InGaN region 21c can reduce degradation of the crystal quality of the optical guiding layer 21.

In this configuration, the second optical guiding layer 23 preferably includes the fourth InGaN region 23c. The distribution of refractive index of the second optical guiding layer 23 can be matched with the distribution of refractive index of the first optical guiding layer 21. In the second optical guiding layer 23, the fourth InGaN region 23c has an indium composition that decreases from the second InGaN region 23a toward the p-type cladding layer 17. In this configuration, since the fourth InGaN region of the optical guiding layer is close to the cladding layer, a decrease in the indium composition of the fourth InGaN region results in only a small decrease in the optical confinement property. On the other hand, a decrease in the indium composition of the fourth InGaN region can reduce degradation of the crystal quality of the optical guiding layer.

In the group III nitride semiconductor laser 11a, to provide a desired far-field pattern and desired electric characteristics, the second optical guiding layer 23 may include either one of the third and fourth InGaN regions 23b and 23c. To provide a desired far-field pattern and desired electric characteristics, the first optical guiding layer 21 may include either one of the fifth and sixth InGaN regions 21b and 21c. To provide a desired far-field pattern and desired electric characteristics, the third barrier layer 41b can include a region having an indium composition gradient in part of or in the entirety of the third barrier layer 41b. To provide a desired far-field pattern and desired electric characteristics, the second barrier layer 39b can include a region having an indium composition gradient in part of or in the entirety of the second barrier layer 39b.

Example 1

Figure 3A:
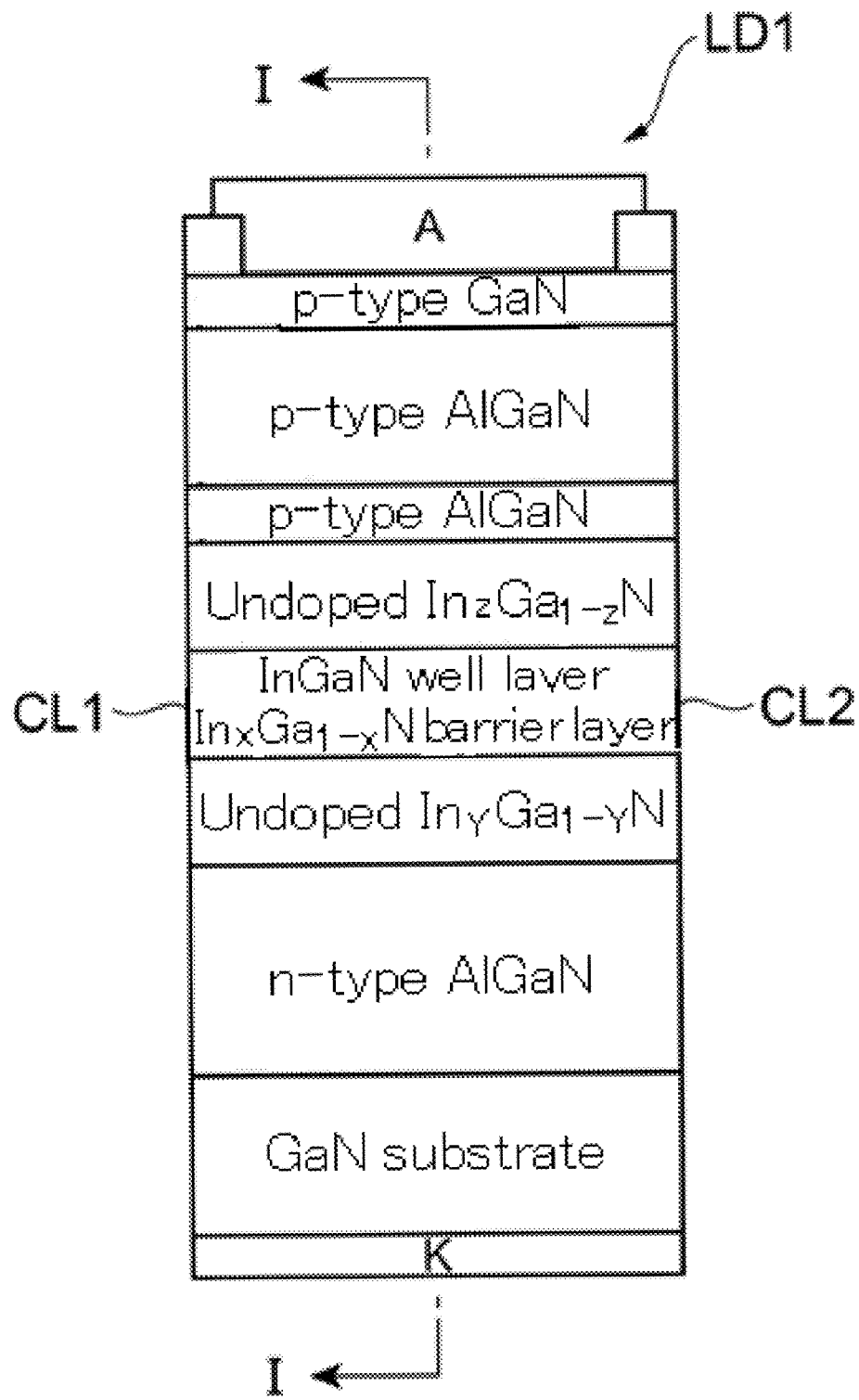
FIG. 3A shows the configuration of a semiconductor laser of an Example according to an embodiment of the present invention.
Figure 3B:
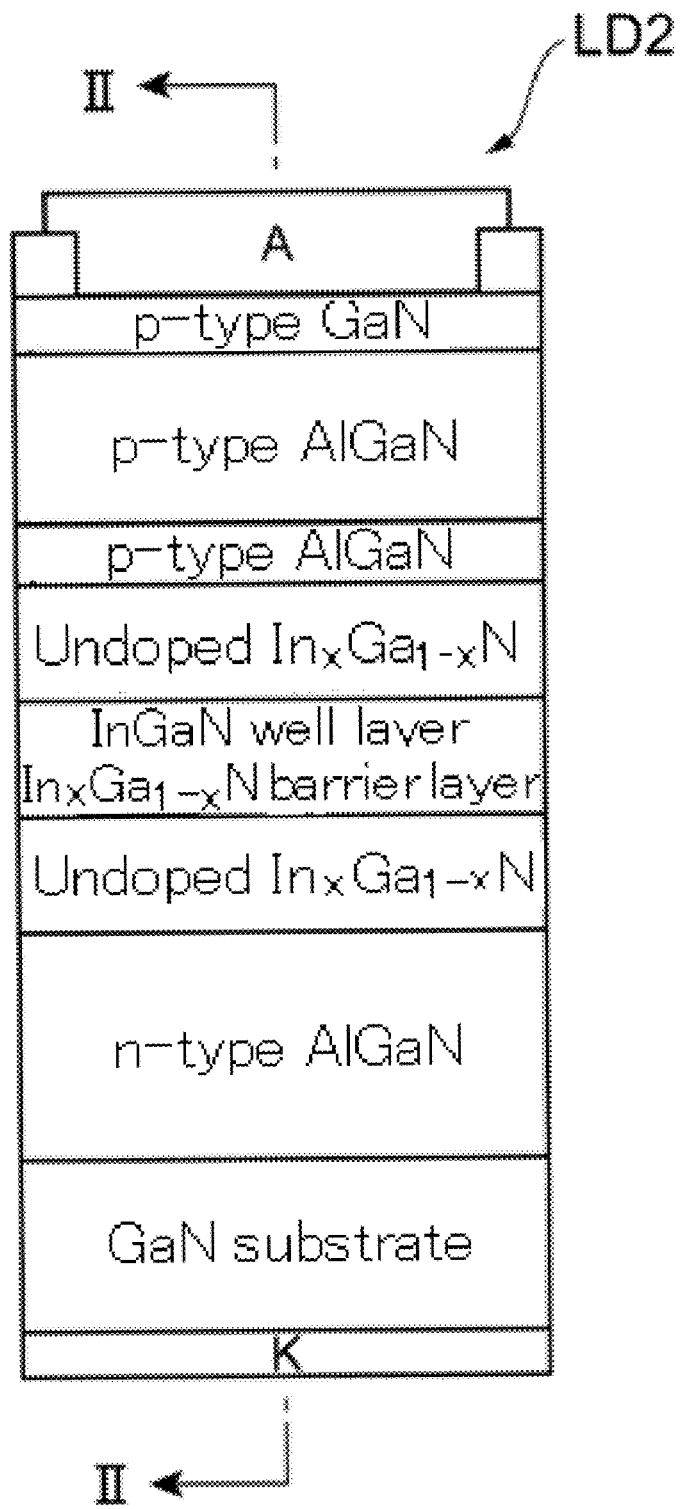
FIG. 3B shows the configuration of a semiconductor laser of an Example according to an embodiment of the present invention.
Figure 3C:
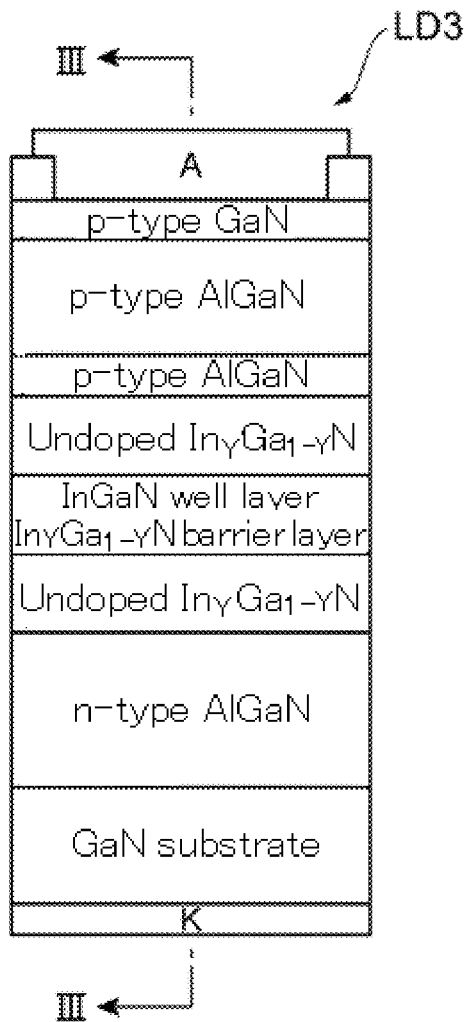
FIG. 3C shows the configuration of a semiconductor laser of an Example according to an embodiment of the present invention.
Figure 4A:
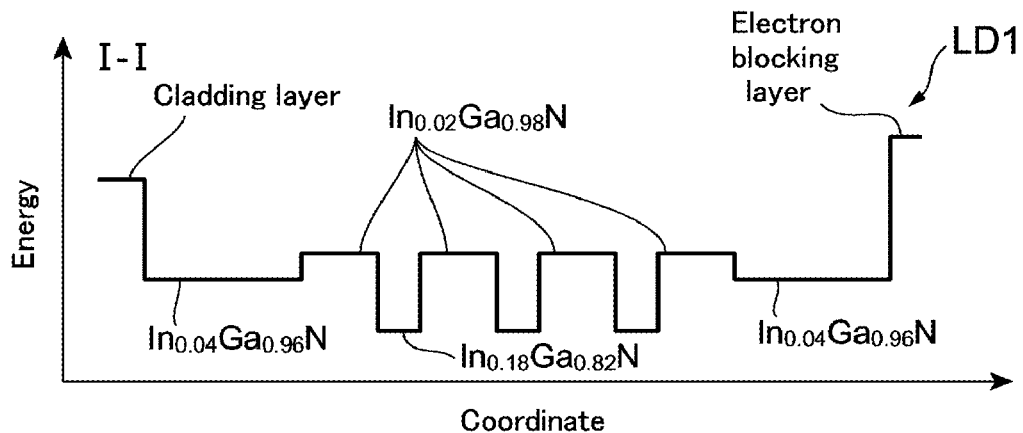
FIG. 4A shows the band diagram of a semiconductor laser.
Figure 4B:
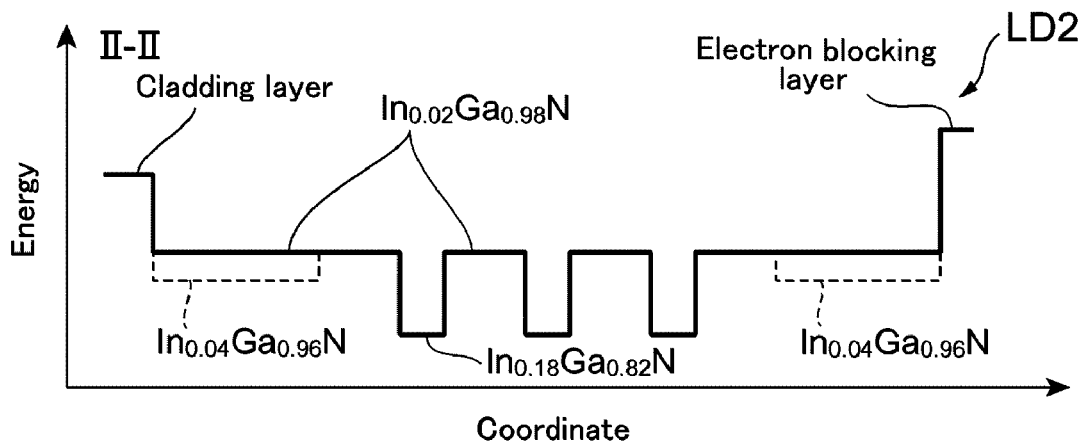
FIG. 4B shows the band diagram of a semiconductor laser.
Figure 4C:
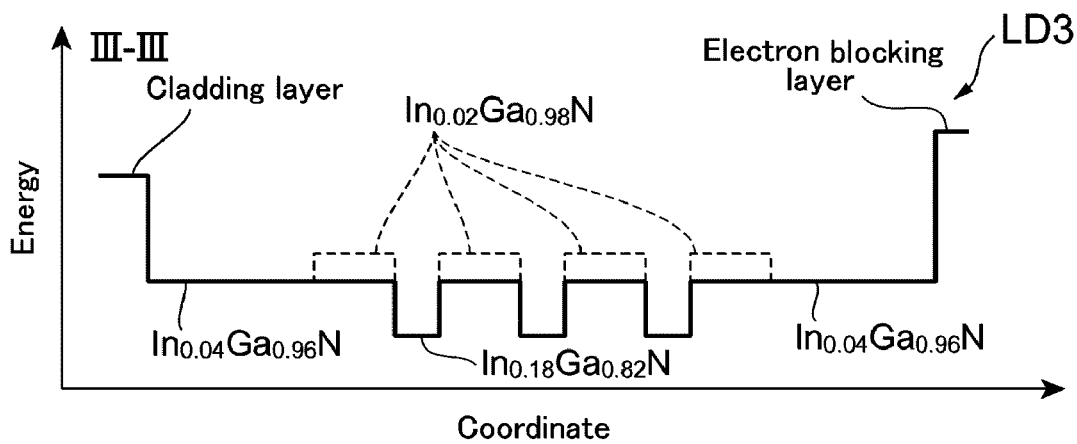
FIG. 4C shows the band diagram of a semiconductor laser.

FIGS. 3A to 3C show the configurations of semiconductor lasers of an Example according to embodiments of the present invention. FIGS. 4A to 4C show the band diagrams of the semiconductor lasers shown in FIG. 3.

Figure 5:
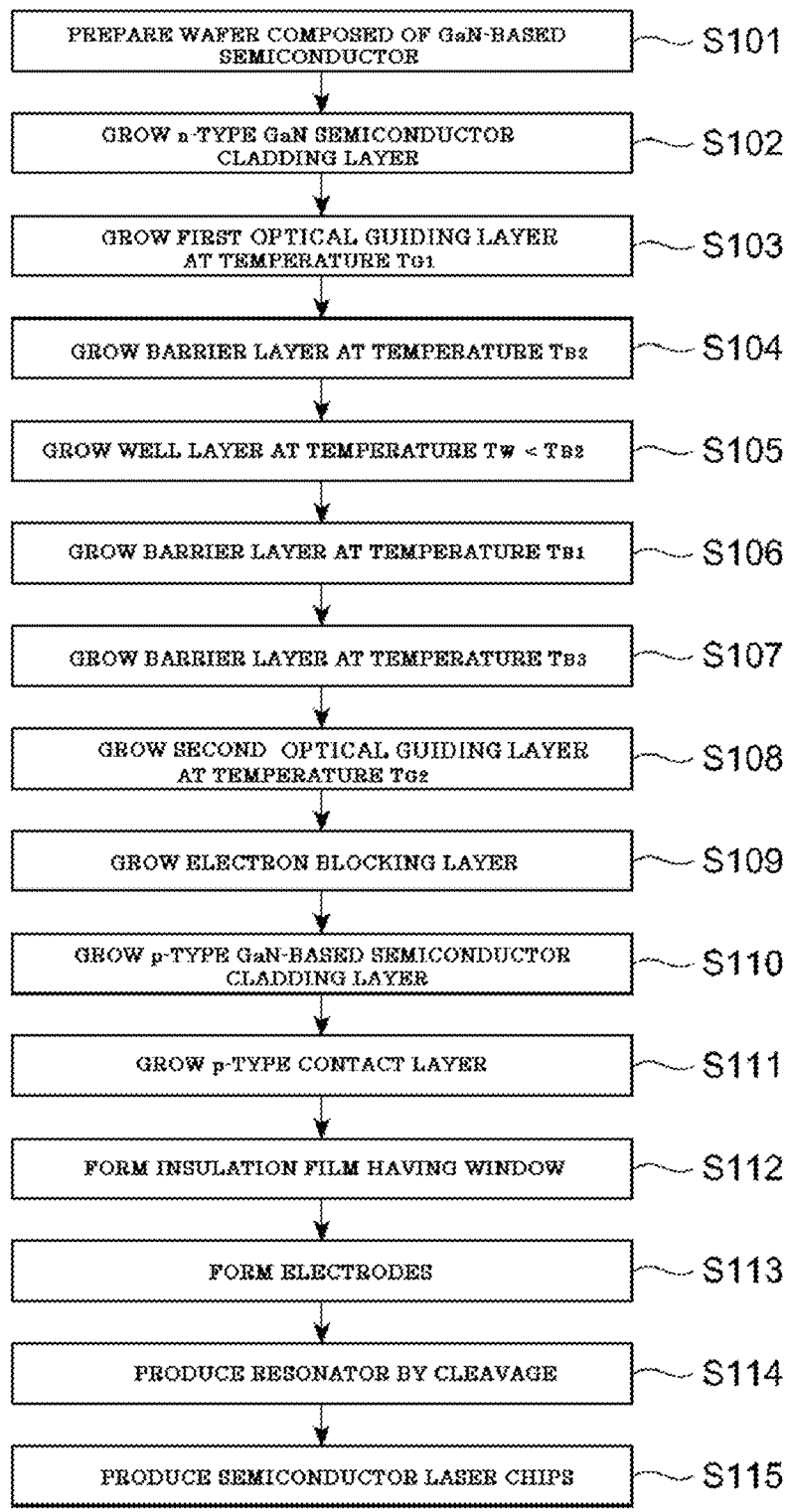
FIG. 5 is a chart showing the flow of steps according to an Example.

FIG. 5 is a chart showing the flow of major steps for producing a semiconductor laser LD1. The production of the semiconductor laser LD1 shown in FIG. 3A will be described with reference to FIG. 5. The semiconductor laser LD1 was produced by metal organic chemical vapor deposition. The sources were trimethylgallium (TMG), trimethylaluminum (TMA), trimethylindium (TMI), ammonia (NH$_3$), silane (SiH$_4$), and biscyclopentadienyl magnesium (CP$_2$Mg). At step S101 of step flow 100, a GaN wafer is prepared. The GaN wafer is composed of n-type GaN and has a main surface having an off angle of 0.3°. The GaN wafer was placed in an metal organic chemical vapor deposition reactor (hereinafter, referred to as the deposition reactor). Ammonia and hydrogen were fed to the deposition reactor and the GaN wafer was subjected to a heat-treatment step in an atmosphere containing these gases at 1050° C. At step S102, an AlGaN cladding layer was grown on the GaN wafer at 1150° C. The AlGaN cladding layer is, for example, an n-type Al$_{0.04}$Ga$_{0.96}$N layer having a thickness of 2 μm.

At step S103, an InGaN optical guiding layer was grown on the AlGaN cladding layer at a film deposition temperature T$_{G1}$. The film deposition temperature T$_{G1}$ is, for example, 840° C. The InGaN optical guiding layer is, for example, an undoped In$_{0.04}$Ga$_{0.96}$N layer having a thickness of 100 nm. The indium composition of this InGaN optical guiding layer is larger than the indium composition of InGaN barrier layers that will be grown later. At step S104, the InGaN barrier layer was grown on the InGaN optical guiding layer at a film deposition temperature T$_{B2}$. The film deposition temperature T$_{B2}$ is higher than the film deposition temperature T$_{G1}$ in Example 1 and, for example, 860° C. The InGaN barrier layer is, for example, an undoped In$_{0.02}$Ga$_{0.98}$N layer having a thickness of 15 nm. At step S105, an InGaN well layer was grown on the InGaN barrier layer at 800° C. The InGaN well layer is, for example, an undoped In$_{0.18}$Ga$_{0.82}$N layer having a thickness of 3 nm. At step S106, an InGaN barrier layer was grown on the InGaN optical guiding layer at a film deposition temperature T$_{B1}$. The film deposition temperature T$_{B1}$ is higher than the film deposition temperature T$_{G1}$ and equal to the film deposition temperature T$_{B2}$ in Example 1 and, for example, 860° C. The InGaN barrier layer is, for example, an undoped In$_{0.02}$Ga$_{0.98}$N layer having a thickness of 15 nm. Subsequently, as in the step S105, an InGaN well layer was grown on the InGaN barrier layer at 800° C. After that, as in the step S106, an InGaN barrier layer was grown on the InGaN well layer at the film deposition temperature T$_{B1}$. As in the step S105, an InGaN well layer was then grown on the InGaN barrier layer at 800° C. In this way, after the steps S105 and S106 were repeated desired times (for example, twice), at step S107, an InGaN barrier layer was grown on the InGaN well layer at a film deposition temperature T$_{B3}$. The film deposition temperature T$_{B3}$ is higher than the film deposition temperature T$_{G1}$ in Example 1 and, for example, 860° C. The InGaN barrier layer is, for example, an undoped In$_{0.02}$Ga$_{0.98}$N layer having a thickness of 15 nm. Thus, an InGaN active layer including the three well layers was produced.

At step S108, an InGaN optical guiding layer was grown on the InGaN active layer at a film deposition temperature T$_{G2}$ lower than the temperature T$_{B2}$. The film deposition temperature T$_{G2}$ is, for example, 840° C. The InGaN optical guiding layer is, for example, an undoped In$_{0.04}$Ga$_{0.96}$N layer having a thickness of 100 nm. The indium composition of this InGaN optical guiding layer is larger than the indium composition of the InGaN barrier layers. In the formation of an optical waveguide region, the higher the indium composition is, the lower the growth temperature is. Since the growth temperature (for example, 860° C.) of a barrier layer is higher than the growth temperature (for example, 840° C.) of a optical guiding layer, crystal quality can be restored upon the formation of the barrier layer. Since a well layer is formed on the barrier layer having restored crystal quality, the well layer also has good crystal quality.

The growth temperature of the InGaN optical guiding layers in Example 1 is preferably 760° C. or more. The growth temperature of the InGaN optical guiding layers is preferably 880° C. or less. The growth temperature of the InGaN well layers in Example 1 is preferably 700° C. or more. The growth temperature of the InGaN well layers is preferably 840° C. or less. The growth temperature of the barrier layers in Example 1 is preferably 800° C. or more. The growth temperature of the barrier layers is preferably 920° C. or less. The growth temperature of the barrier layers is higher than the growth temperature of the optical guiding layers. The growth temperature of the optical guiding layers is higher than the growth temperature of the well layers.

At step S109, an AlGaN electron blocking layer was grown on the InGaN optical guiding layer at 1100° C. The AlGaN electron blocking layer is, for example, a p-type $Al_{0.12}Ga_{0.88}N$ layer having a thickness of 20 nm. At step S110, an AlGaN cladding layer was grown on the AlGaN electron blocking layer at 1100° C. The AlGaN cladding layer is, for example, a p-type $Al_{0.04}Ga_{0.96}N$ layer having a thickness of 400 nm. At step S111, a GaN contact layer was grown on the AlGaN cladding layer at 1100° C. The GaN contact layer has a thickness of, for example, 50 nm. Thus, an epitaxial wafer was produced. After the epitaxial wafer was taken out from the deposition reactor, at step S112, an insulation film was grown on the contact layer. The insulation film is composed of, for example, silicon oxide grown by a CVD method. A contact window having a width of 10 μm was formed.

At step S113, an anode electrode was formed on the contact window and the insulation layer. An anode electrode A is constituted by, for example, Ni/Au formed by vacuum deposition. Subsequently, a pad electrode was formed so as to be connected to the anode electrode. The pad electrode is constituted by, for example, Ti/Au formed by vacuum deposition. After the back surface of the substrate was ground, at step S113, a cathode electrode was formed on the ground back surface. A cathode electrode K is constituted by, for example, Ti/Al formed by vacuum deposition. Subsequently, a pad electrode was formed so as to be connected to the cathode electrode. The pad electrode is constituted by, for example, Ti/Au formed by vacuum deposition. Thus, a substrate product was produced.

At step S114, the substrate product was cleaved to produce laser bars. Each laser bar had cleaved surfaces CL1 and CL2 and had a cavity length of 800 μm. At step S115, a gain-guided-type semiconductor laser was produced from the laser bar.

Next, the production of semiconductor lasers LD2 and LD3 will be described. Substrates of the same type as in the semiconductor laser LD1 were prepared. For the semiconductor laser LD2, optical guiding layers were composed of $In_{0.02}Ga_{0.98}N$ and barrier layers were also composed of $In_{0.02}Ga_{0.98}N$. The optical guiding layers and the barrier layers were grown at a growth temperature of 860° C. For the semiconductor laser LD3, optical guiding layers were composed of $In_{0.04}Ga_{0.96}N$ and barrier layers were also composed of $In_{0.04}Ga_{0.96}N$. The optical guiding layers and the barrier layers were grown at a growth temperature of 840° C. Conditions other than the growth conditions of the optical guiding layers and the barrier layers were not changed.

The semiconductor lasers LD1, LD2, and LD3 were operated by current injection. All the semiconductor lasers lased in the range of 430 nm or more to 440 nm.

|  | LD1 | LD2 | LD3 |
|---|---|---|---|
| In composition of guiding layers | 0.04 | 0.02 | 0.04 |
| In composition of barrier layers | 0.02 | 0.02 | 0.04 |
| Threshold | 550 mA | 900 mA | 600 mA |

The semiconductor laser LD1 of the working example exhibited the best characteristics.

Comparison of optical confinement was conducted by far-field pattern (FFP) evaluation and the semiconductor laser LD2 was inferior to the other two semiconductor lasers (LD1 and LD3). This is probably because the optical guiding layers and the barrier layers of the semiconductor laser LD2 had the low In composition. Such a poor optical confinement property probably caused the large threshold current. Although the semiconductor laser LD3 had a good optical confinement property, the semiconductor laser LD3 had the large threshold current. This is probably because the barrier layers of the semiconductor laser LD3 had the high In composition, which degraded the crystal quality of the well layers. The semiconductor laser LD1 had the small threshold probably because the low In composition of the barrier layers enhanced the crystal quality of the light-emitting layer and use of the InGaN guiding layers having the high In composition resulted in a sufficiently good optical confinement property. There is a high probability that the crystal quality degrades after the InGaN well layers having the highest In composition are grown. However, the low In composition of the barrier layers and the high growth temperature of the barrier layers probably contribute to the restoration of the crystal quality.

Example 2

Figure 4D:
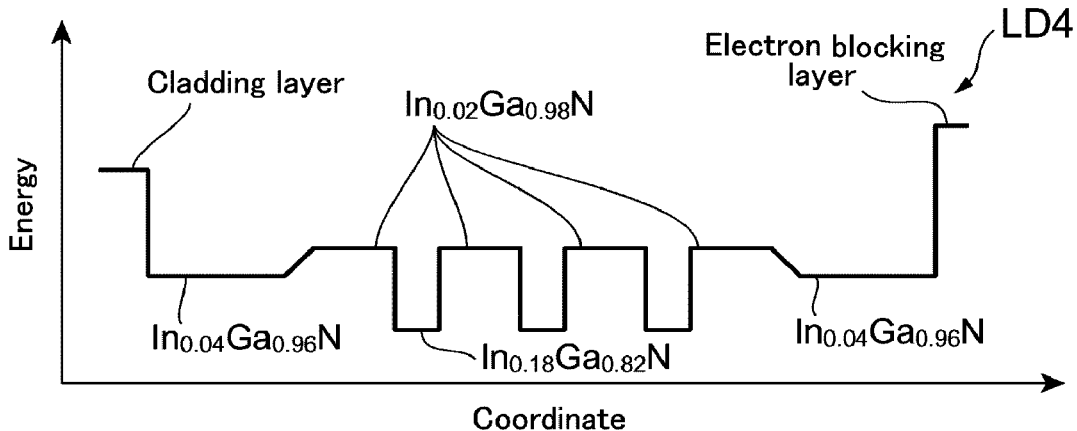
FIG. 4D shows the band diagram of a semiconductor laser.

A semiconductor laser LD4 having a band diagram shown in FIG. 4D was produced. The semiconductor laser LD4 had an In composition gradient in the boundary between a optical guiding layer and a barrier layer. This composition gradient was achieved by continuously changing growth temperature. The composition gradient was formed in a region extending from the boundary of the optical guiding layer and the barrier layer to the optical guiding layer side by 10 nm and to the barrier layer side by 10 nm (in total, 20 nm).

The semiconductor laser LD4 was produced as in Example 1. The semiconductor laser LD4 was operated by current injection and the lasing wavelength was 431 nm.

|  | LD1 | LD4 (composition gradient) |
|---|---|---|
| In composition of guiding layers | 0.04 | 0.04 |
| In composition of barrier layers | 0.02 | 0.02 |
| Threshold | 550 mA | 500 mA |

The semiconductor laser LD4 had the threshold smaller than that of the semiconductor laser LD1. This is probably because the composition gradient improved the injection efficiency of carriers into the active layer.

Figure 6A:
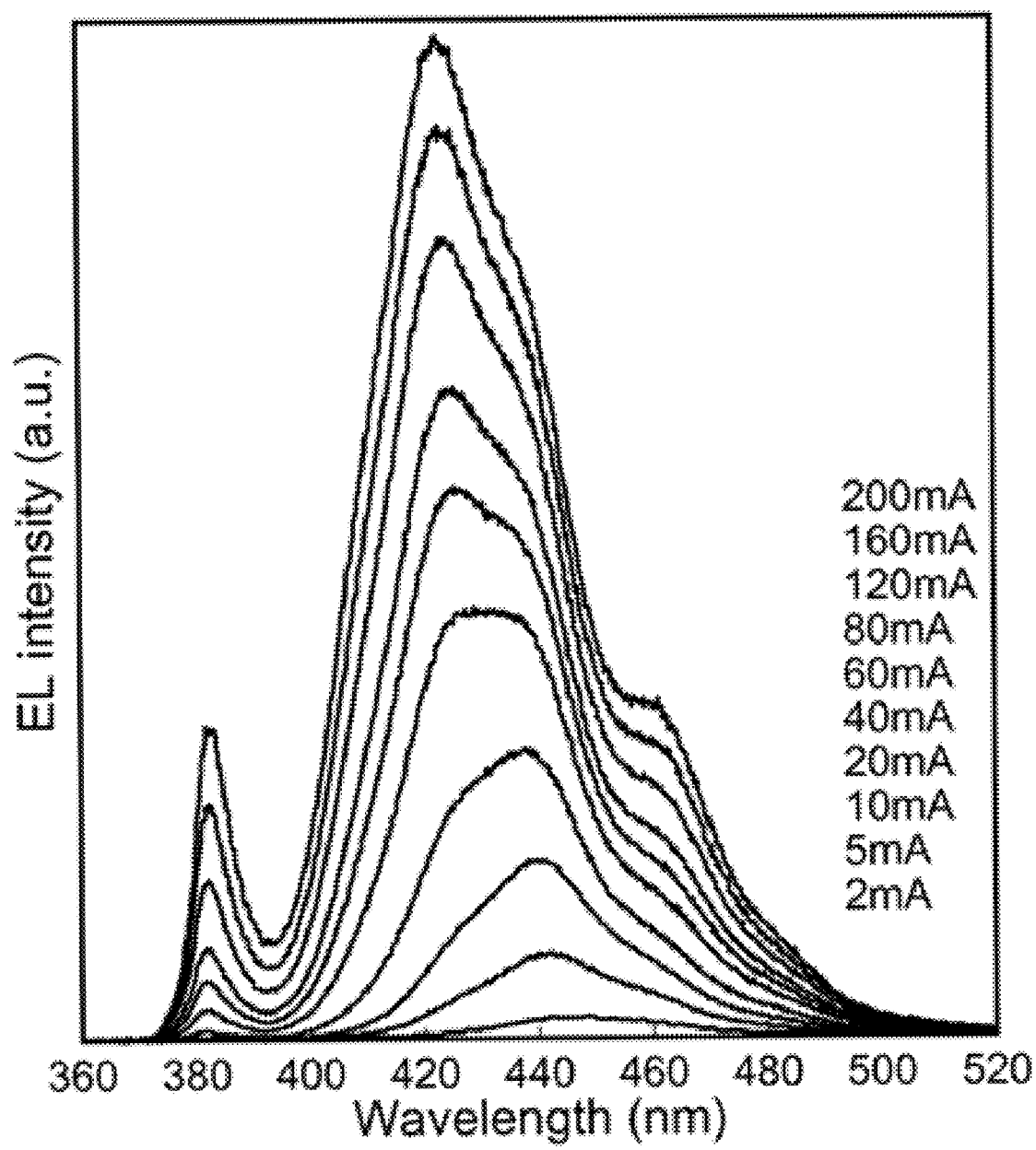
FIG. 6A shows the measurement result of electroluminescence.
Figure 6B:
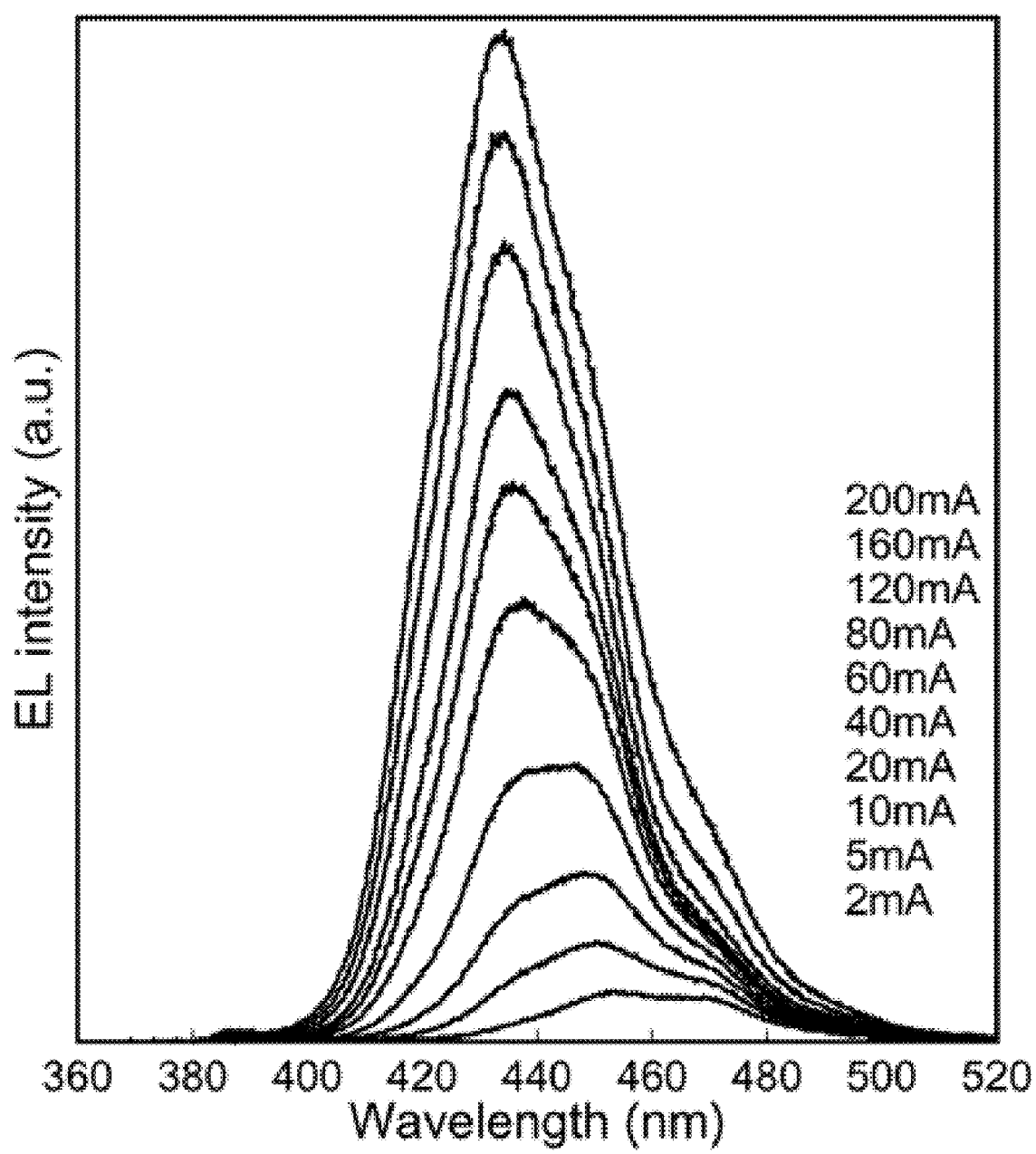
FIG. 6B shows the measurement result of electroluminescence.

The electroluminescence (EL) spectra of the substrate products of the semiconductor lasers LD1 and LD4 were measured. FIGS. 6A and 6B show the measurement results of the EL spectra. Referring to FIG. 6A, two EL peaks at about the wavelengths of 380 nm and 420 nm were observed for the substrate product of the semiconductor laser LD1. Referring to FIG. 6B, a single EL peak at about the wavelength of 430 nm was observed for the substrate product of the semiconductor laser LD4. The two peaks in the EL spectrum probably show that carriers are accumulated in the guiding layers in the semiconductor laser LD1. The single peak in the EL spectrum probably shows that the injection efficiency of carriers from the guiding layers into the active layer has been enhanced in the semiconductor laser LD 4.

Figure 7:
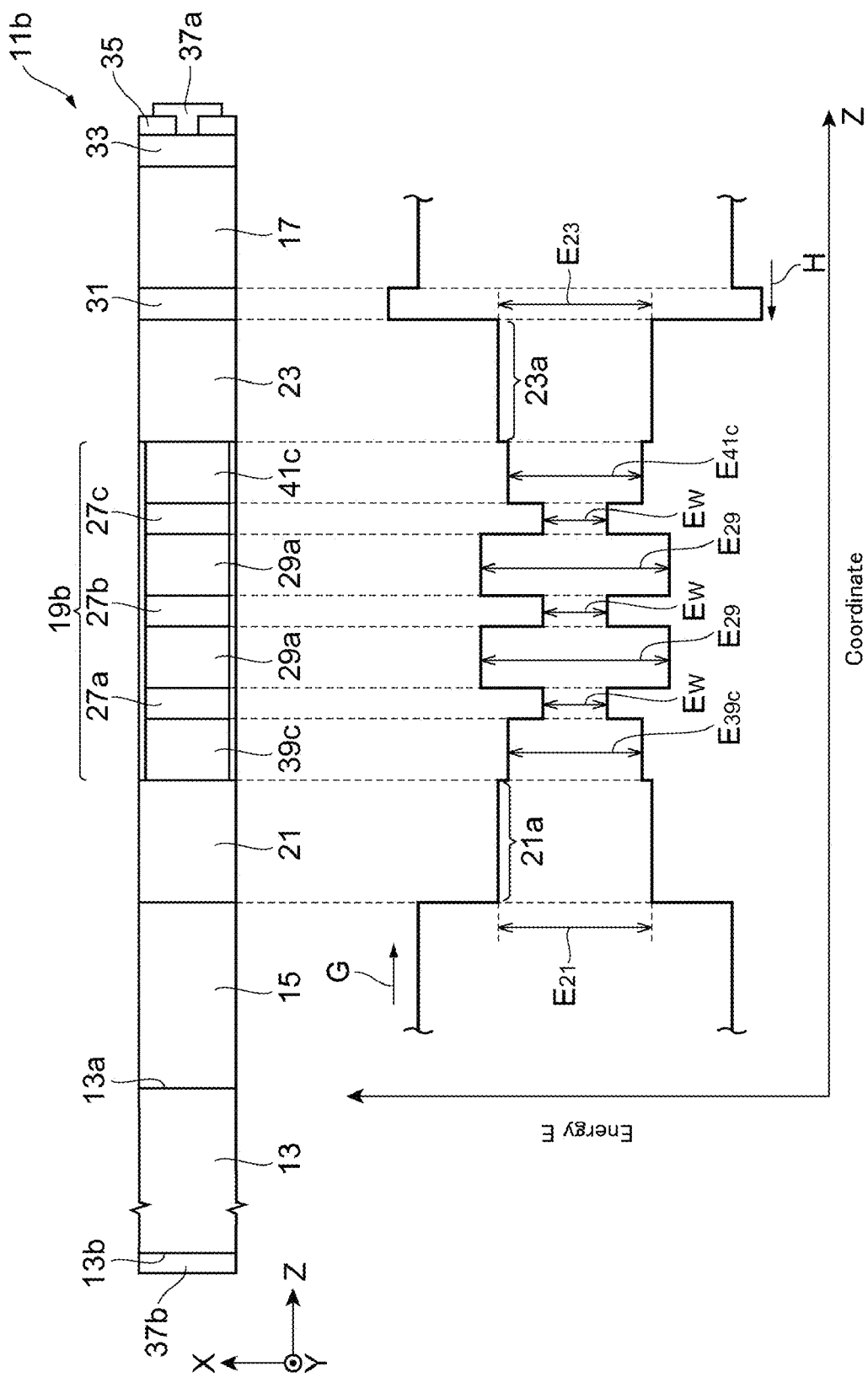
FIG. 7 is a schematic view showing the configuration of a group III nitride semiconductor laser according to an embodiment of the present invention.

FIG. 7 is a schematic view showing the configuration of a group III nitride semiconductor laser according to an embodiment of the present invention. In a group III nitride semiconductor laser 11b, an active layer 19b includes second and third barrier layers 39c and 41c.

The second barrier layer 39c includes a portion having a band gap smaller than the band gap of a first InGaN region 21a. In the present Example, the indium composition of the entire of the second barrier layer 39c is smaller than the indium composition of the first InGaN region 21a. In this group III nitride semiconductor laser, carriers smoothly flow from a optical guiding layer 21 to a well layer 27a.

The third barrier layer 41c includes a portion having a band gap smaller than the band gap of a second InGaN region 23a. In the present Example, the indium composition of the entire of the third barrier layer 41c is smaller than the indium composition of the second InGaN region 23a. In this group III nitride semiconductor laser, carriers smoothly flow from a optical guiding layer 23 to a well layer 27c.

If necessary, in the group III nitride semiconductor laser 11b, the first optical guiding layer 21 may include an eighth InGaN region 21c as in the group III nitride semiconductor laser 11a. The eighth InGaN region 21c is provided between the first InGaN region 21a and an n-type cladding layer 15. The eighth InGaN region 21c has an indium composition that decreases in the direction from the first InGaN region 21a to the n-type cladding layer 15. Since the eighth InGaN region 21c is close to the cladding layer 15, a decrease in the indium composition of the eighth InGaN region 21c results in only a small decrease in the optical confinement property. On the other hand, a decrease in the indium composition of the eighth InGaN region 21c can reduce degradation of the crystal quality of the optical guiding layer 21.

In this configuration, the second optical guiding layer 23 preferably includes a seventh InGaN region 23c as in the group III nitride semiconductor laser 11a. The distribution of refractive index of the second optical guiding layer 23 can be matched with the distribution of refractive index of the first optical guiding layer 21. In the second optical guiding layer 23, the seventh InGaN region 23c has an indium composition that decreases from the second InGaN region 23a toward the p-type cladding layer 17. Since the seventh InGaN region is close to the cladding layer, a decrease in the indium composition of the seventh InGaN region results in only a small decrease in the optical confinement property.

Example 3

A semiconductor laser LD5 was produced in a manner similar to that in Example 1. The first and second optical guiding layers had an indium composition of 0.04. The second and third barrier layers had an indium composition of 0.05. The second and third barrier layers had a thickness of 15 nm. The growth temperature of the second and third barrier layers was 830° C. The threshold of the semiconductor laser LD5 was low and almost equal to that in Example 2. According to the measurement result of EL spectrum, the peak derived from the optical guiding layers was extremely small. In the semiconductor laser LD5, accumulation of carriers in the optical guiding layers is avoided as with the semiconductor laser in Example 2 and carrier injection efficiency is enhanced. The light-emitting characteristics of the semiconductor laser LD5 are better than the light-emitting characteristics of the semiconductor lasers LD2 and 3. This is probably because the small In composition of the inner two barrier layers allowed an increase in the growth temperature of these barrier layers and, as a result, the crystal quality was restored.

In the group III nitride semiconductor laser 11b, the second barrier layer 39c may have an In composition gradient in which the In composition gradually increases in the direction from the optical guiding layer 21 to the well layer 27a. The second barrier layer 39c and the optical guiding layer 21 may have an In composition gradient in which the In composition gradually increases in the direction from the n-type cladding layer 15 to the well layer 27a. The third barrier layer 41c may have an In composition gradient in which the In composition gradually increases in the direction from the optical guiding layer 23 to the well layer 27c. The third barrier layer 41c and the optical guiding layer 23 may have an In composition gradient in which the In composition gradually increases in the direction from the p-type cladding layer 17 to the well layer 27c.

Experiments performed by the inventors show that, in the first optical guiding layer 21, the InGaN region 21a having an indium composition of 0.03 or more can impart a high refractive index to the optical guiding layer 21. The InGaN region 21a having an indium composition of more than 0.12 degrades the crystal quality of the optical guiding layer 21. In the second optical guiding layer 23, the InGaN region 23a having an indium composition of 0.03 or more can impart a high refractive index to the optical guiding layer 23. The InGaN region 23a having an indium composition of more than 0.12 degrades the crystal quality of the optical guiding layer 23.

The first optical guiding layer 21 preferably has a thickness of 150 nm or less. When the optical guiding layer 21 having a high indium composition has a thickness of more than 150 nm, the crystal quality is not sufficiently restored in the growth of the active layer 19 and hence the crystal quality of the active layer 19 is degraded. The second optical guiding layer 23 preferably has a thickness of 150 nm or less. To conduct good optical confinement, the first optical guiding layer 21 preferably has a thickness of 25 nm or more. To conduct good optical confinement, the second optical guiding layer 23 preferably has a thickness of 25 nm or more. The far-field pattern of a semiconductor laser can be adjusted by adjusting the thickness of the first optical guiding layer 21 and the second optical guiding layer 23.

Figure 8:
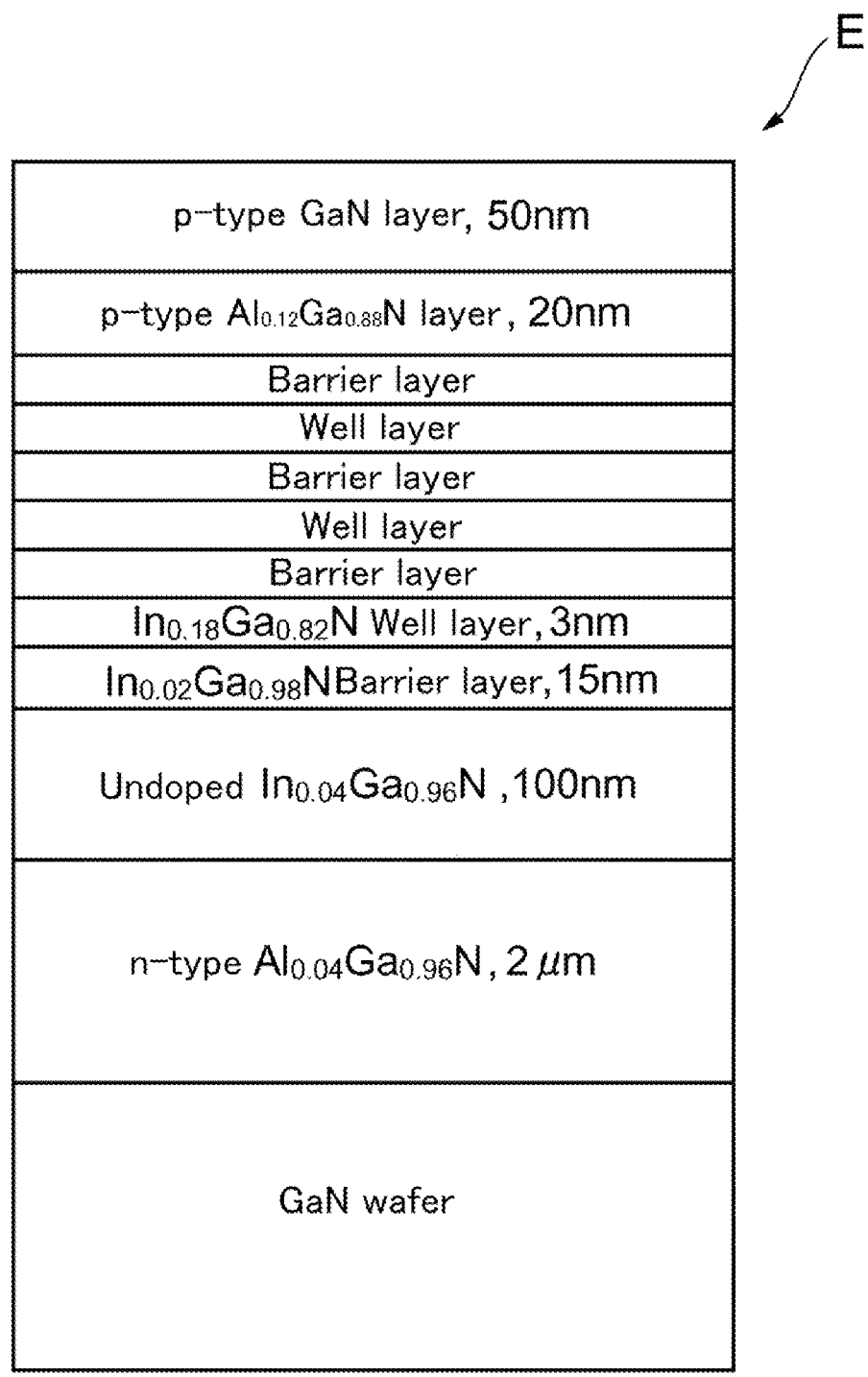
FIG. 8 shows the configuration of an epitaxial wafer in which cathodoluminescence is measured.
Figure 9A:
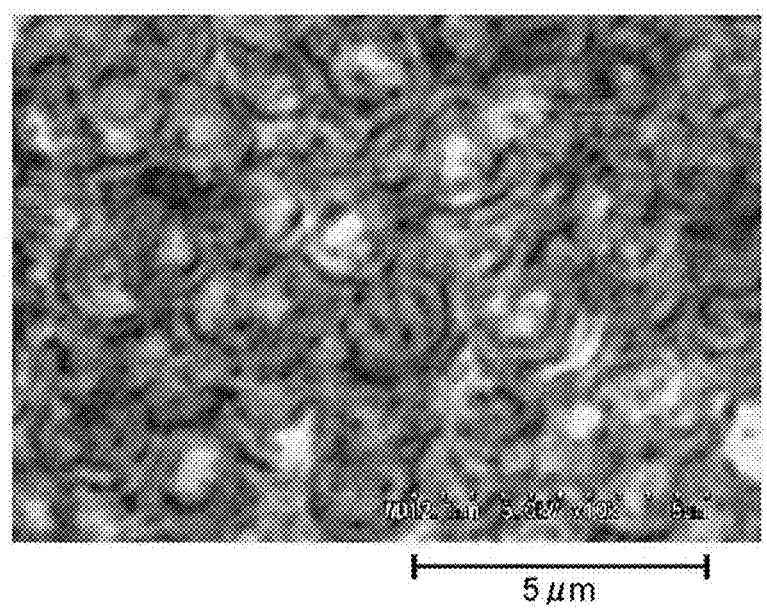
FIG. 9A shows a cathodoluminescence image.
Figure 9B:
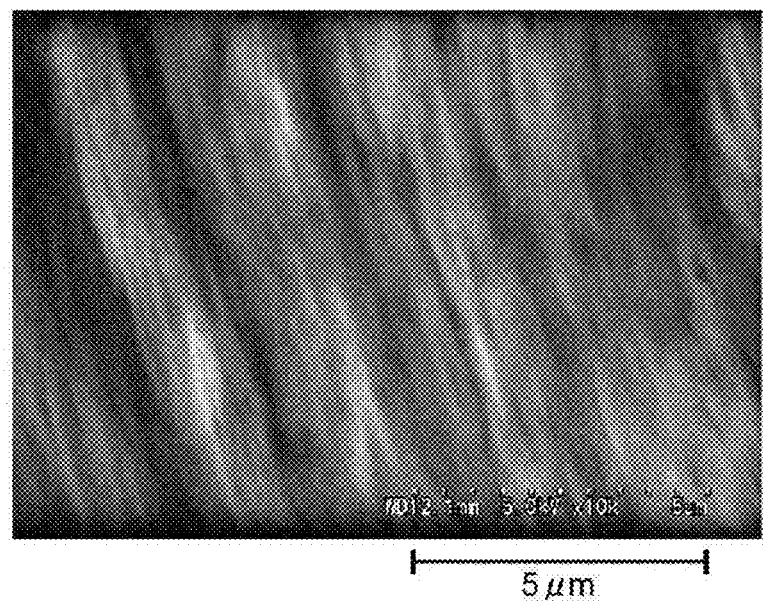
FIG. 9B shows a cathodoluminescence image.

FIG. 8 shows the configuration of an epitaxial wafer in which cathodoluminescence is measured. To obtain an electron-beam image of the light-emitting layer with an electron-beam, unlike the epitaxial wafers in Examples 1, 2, and the like, an epitaxial wafer E does not include a p-side InGaN optical guiding layer or a p-type cladding layer. A GaN wafer having a main surface that is off 2° in the direction of the a-axis and a GaN wafer having a main surface that is exactly conform to the c-plane were prepared. Epitaxial growth was conducted on these wafers. FIGS. 9A and 9B show cathodoluminescence (CL) images. Referring to FIG. 9A, a CL image having an island pattern was observed. This image shows that a multiple quantum well structure was grown to have an island pattern. Referring to FIG. 9B, a CL image having a streak pattern was observed. This image shows that a multiple quantum well structure was formed by step-flow growth. As the off angle increases, the step density increases. Thus, growth in an island pattern is suppressed. According to experiments by the inventors, the off angle of a main surface of a wafer composed of a group III nitride semiconductor such as GaN or InGaN is preferably inclined at an angle of 1° or more with respect to the c-plane of the group III nitride semiconductor and is preferably inclined at an angle of 50° or less with respect to the c-plane of the group III nitride semiconductor. In such a group III nitride semiconductor laser, a surface inclined with respect to the c-plane is suitable for growing InGaN having a high indium composition. There is also an advantage that an off angle of 10° or more can result in a reduction in a piezoelectric field.

The direction in which a main surface of a wafer is inclined can be the a-axis direction of a group III nitride semiconductor. A resonator can be produced by m-plane cleavage.

Example 4

GaN wafers having off angles of 2°, 20°, and 40° in the direction of the a-axis were prepared. The same laser structures as in Example 1 were produced on these GaN wafers. Laser waveguides were formed in the direction of the m-axis. After electrodes were formed, cleavage along the m-plane was conducted to produce laser bars.

| Off angle | Threshold current |
|---|---|
| 0.3° | 550 mA (Example 1) |
| 2° | 500 mA |
| 20° | 550 mA |
| 40° | 550 mA |

The semiconductor laser produced on the GaN wafer having an off angle of 2° had a threshold current of about 500 mA, which is lower than that in Example 1. This is probably because the step-flow growth improved crystal quality and surface flatness. The semiconductor lasers produced on the GaN wafers having off angles of 20° and 40° had a threshold current equal to or slightly higher than that in Example 1. When an off angle is large, incorporation of indium is suppressed in the growth of an InGaN layer. For this reason, a decrease in the growth temperature of InGaN was required. However, further improvement is probably possible because the threshold current is substantially equal to that in Example 1. Wafers having these off angles have a small piezoelectric field and hence a blue shift until lasing is smaller than that in Example 1.

The group III nitride semiconductor lasers 11, 11a, and 11b can be produced from high quality GaN wafers having a threading dislocation density of $10^6$ cm$^{-2}$ or less. The semiconductor lasers can be produced from GaN wafers having a diameter of 45 mm or more.

Substrates for the group III nitride semiconductor lasers 11, 11a, and 11b can be composed of InGaN. The lattice mismatch between a optical guiding layer having a large indium composition and a substrate can be reduced.

Example 6

An InGaN substrate having an off angle of 2° in the direction of the a-axis was prepared. The InGaN substrate is composed of $In_{0.05}Ga_{0.95}N$. An epitaxial wafer for a laser structure was formed on this InGaN substrate as described below. The InGaN substrate was placed in a deposition reactor. While nitrogen is fed into the deposition reactor, the temperature of the InGaN substrate was increased to 800° C. An AlGaN layer was grown on the InGaN substrate. The AlGaN layer is composed of n-type $Al_{0.02}Ga_{0.98}N$ and has a thickness of, for example, 10 nm. The growth temperature of AlGaN is, for example, 800° C. Subsequently, an n-type cladding layer was grown on the AlGaN layer. The n-type cladding layer is composed of, for example, Si-doped GaN and has a thickness of, for example, 2 µm. The growth temperature of GaN is, for example, 1100° C. After the temperature of the deposition reactor was decreased to 800° C., a optical guiding layer was grown on the n-type cladding layer. The optical guiding layer is composed of, for example, undoped $In_{0.08}Ga_{0.92}N$ and has a thickness of, for example, 100 nm.

Next, an active layer was grown. The active layer includes, for example, well layers composed of InGaN and barrier layers composed of InGaN. For example, the well layers are composed of $In_{0.30}Ga_{0.70}N$ and have a thickness of 2 nm. For example, the barrier layers are composed of $In_{0.05}Ga_{0.95}N$ and have a thickness of 15 nm. The active layer includes three well layers. The growth temperature of the well layers is, for example, 770° C. The growth temperature of the barrier layers is, for example, 830° C.

A optical guiding layer was grown on the active layer. The optical guiding layer is composed of, for example, undoped $In_{0.08}Ga_{0.92}N$, and has a thickness of, for example, 100 nm. The growth temperature of the optical guiding layer is, for example, 800° C. An electron blocking layer was grown on the optical guiding layer. The electron blocking layer is composed of, for example, Mg-doped p-type $Al_{0.10}Ga_{0.90}N$, and has a thickness of, for example, 20 nm. The growth temperature of the electron blocking layer is, for example, 1100° C. A p-type cladding layer was grown on the electron blocking layer. The p-type cladding layer is composed of, for example, Mg-doped $Al_{0.02}Ga_{0.98}N$, and has a thickness of, for example, 400 nm. The growth temperature of GaN is, for example, 1100° C. A p-type contact layer was grown on the p-type cladding layer. The p-type contact layer is composed of, for example, Mg-doped GaN, and has a thickness of, for example, 50 nm. The growth temperature of GaN is, for example, 1100° C. By conducting these steps, an epitaxial wafer was produced. A semiconductor laser LD6 was produced from this epitaxial wafer.

An epitaxial wafer was produced by producing a laser structure similar to that of the semiconductor laser LD6 on a GaN substrate having an off angle of 2°. A semiconductor laser LD7 was produced from this epitaxial wafer.

The semiconductor lasers LD6 and LD7 lased. The lasing wavelength was 470 to 480 nm. The thresholds of the semiconductor lasers LD6 and LD7 were respectively about 1500 mA and about 1700 mA. Since the semiconductor laser LD6 was produced on the InGaN substrate, the occurrence of strain or defects due to the lattice mismatch between the substrate and the epitaxial films is reduced even when the InGaN thick films having In compositions of several percent were grown. This is probably a cause that the threshold was reduced.

The principles of the present invention have been described with preferred embodiments with reference to the drawings. However, it will be apparent to one skilled in the art that the present invention can be changed in terms of arrangement and details without departing from the principles. The present invention is not restricted to the specific configurations disclosed in the embodiments. Therefore, the present invention embraces all modifications and changes within the spirit and scope of the appended claims.

INDUSTRIAL APPLICABILITY

A nitride semiconductor laser diode emitting light at a long lasing wavelength of 430 nm or more has been demanded. In such a laser diode, when guided light has a long wavelength, the difference in refractive index between the cladding layer and the guiding layer becomes small. A technique is required with which optical confinement is enhanced compared with blue-violet laser (wavelength: about 405 nm) used for Blu-ray or HD-DVD. To enhance optical confinement, InGaN is used as a material for barrier layers and guiding layers, and the In compositions of the barrier layers and the guiding layers are increased.

An epitaxial wafer of a semiconductor laser includes multilayered epitaxial films. In a nitride semiconductor laser diode according to the present invention has high InGaN proportion in this multilayer structure. Thus, the crystal quality of the epitaxial films degrades. Such degradation of the crystal quality tends to occur after a well layer having a high In composition is grown.

To avoid such degradation of the crystal quality, the In composition of barrier layers sandwiching well layers is reduced. This reduction decreases the average refractive index of the waveguide. To avoid this decrease, for example, the In composition of optical guiding layers is increased. Optical confinement can be maintained and the crystal quality of a multiple quantum well structure can be improved. When the barrier layers having a low In composition are grown, the crystal quality is restored. Since the optical guiding layers have a high refractive index, a desired optical confinement is provided.

The optical guiding layers in part have an In composition gradient. A reduction in carrier injection efficiency can be avoided even when optical guiding layers having a high In composition are used. The In composition gradient of the optical guiding layers can result in the avoidance of accumulation of carriers in optical guiding layers having a high In composition.

A free-standing GaN wafer having an off angle is used. The probability of occurrence of degradation of crystal quality is low even when an InGaN region is thick. When an InGaN region is thick, a surface morphology in an island pattern tends to be generated. Use of a GaN substrate having a large off angle increases the step density of a main surface of the substrate.

Thus, the surface morphology in an island pattern is suppressed.

The invention claimed is:

1. A group III nitride semiconductor laser comprising:
   a substrate having a main surface;
   an n-type cladding layer provided on the substrate and composed of a group III nitride semiconductor;
   a p-type cladding layer provided on the substrate and composed of a group III nitride semiconductor;
   an active layer provided between the n-type cladding layer and the p-type cladding layer;
   a first optical guiding layer provided between the n-type cladding layer and the active layer; and
   a second optical guiding layer provided between the p-type cladding layer and the active layer,
   wherein the active layer includes a plurality of well layers and at least one first barrier layer provided between the well layers,
   the first optical guiding layer includes a first InGaN region composed of InGaN that has a band gap smaller than a band gap of the first barrier layer and larger than a band gap of the well layers,
   the second optical guiding layer includes a second InGaN region that is composed of InGaN,
   among the well layers of the active layer, a well layer that is closest to the first optical guiding layer is a first well layer,
   among the well layers of the active layer, a well layer that is closest to the second optical guiding layer is a second well layer, and
   the active layer includes a second barrier layer provided between the first well layer and the first optical guiding layer, and a third barrier layer provided between the second well layer and the second optical guiding layer.

2. The group III nitride semiconductor laser according to claim 1, wherein
   the second InGaN region is composed of InGaN that has a band gap smaller than the band gap of the first barrier layer and larger than the band gap of the well layers;
   the second barrier layer includes a portion having a band gap larger than the band gap of the first InGaN region; and
   the third barrier layer includes a portion having a band gap larger than a band gap of the second InGaN region.

3. The group III nitride semiconductor laser according to claim 1, wherein the first barrier layer is composed of a gallium nitride-based semiconductor, and the second and third barrier layers are composed of the gallium nitride-based semiconductor.

4. The group III nitride semiconductor laser according to claim 1, wherein
   the second optical guiding layer further includes a third InGaN region provided between the third barrier layer and the second InGaN region, and
   the third InGaN region has an indium composition that increases in a direction from the third barrier layer to the second InGaN region.

5. The group III nitride semiconductor laser according to claim 4, wherein
   the third barrier layer includes an InGaN region, and
   the InGaN region of the third barrier layer has an indium composition that increases in a direction from the second well layer to the second InGaN region.

6. The group III nitride semiconductor laser according to claim 1, wherein
   the second optical guiding layer further includes a fourth InGaN region provided between the second InGaN region and the p-type cladding layer, and
   the fourth InGaN region has an indium composition that decreases from the second InGaN region toward the p-type cladding layer.

7. The group III nitride semiconductor laser according to claim 1, wherein
   the first optical guiding layer further includes a fifth InGaN region provided between the second barrier layer and the first InGaN region, and
   the fifth InGaN region has an indium composition that increases in a direction from the second barrier layer to the first InGaN region.

8. The group III nitride semiconductor laser according to claim 7, wherein
   the second barrier layer includes an InGaN region, and
   the InGaN region of the second barrier layer has an indium composition that increases in a direction from the first well layer to the first InGaN region.

9. The group III nitride semiconductor laser according to claim 1, wherein
   the first optical guiding layer further includes a sixth InGaN region provided between the first InGaN region and the n-type cladding layer, and
   the sixth InGaN region has an indium composition that decreases in a direction from the first InGaN region to the n-type cladding layer.

10. The group III nitride semiconductor laser according to claim 1, wherein
    the second barrier layer includes a portion having a band gap smaller than the band gap of the first InGaN region; and
    the third barrier layer includes a portion having a band gap smaller than a band gap of the second InGaN region.

11. The group III nitride semiconductor laser according to claim 10, wherein
    the second optical guiding layer further includes a seventh InGaN region provided between the second InGaN region and the p-type cladding layer, and
    the seventh InGaN region has an indium composition that decreases from the second InGaN region toward the p-type cladding layer.

12. The group III nitride semiconductor laser according to claim 10, wherein
the first optical guiding layer further includes an eighth InGaN region provided between the first InGaN region and the n-type cladding layer, and
the eighth InGaN region has an indium composition that decreases in a direction from the first InGaN region to the n-type cladding layer.

13. The group III nitride semiconductor laser according to any claim 1, wherein the active layer includes a multiple quantum well structure provided such that the group III nitride semiconductor laser has a light-emitting wavelength in a wavelength region of 430 nm or more.

14. The group III nitride semiconductor laser according to claim 1, wherein
the first optical guiding layer has a thickness of 150 nm or less, and
the second optical guiding layer has a thickness of 150 nm or less.

15. The group III nitride semiconductor laser according to claim 1, wherein
the first InGaN region of the first optical guiding layer has an indium composition of 0.03 or more, and
the second InGaN region of the second optical guiding layer has an indium composition of 0.03 or more.

16. The group III nitride semiconductor laser according to claim 1, wherein
the first InGaN region of the first optical guiding layer has an indium composition of 0.12 or less, and
the second InGaN region of the second optical guiding layer has an indium composition of 0.12 or less.

17. The group III nitride semiconductor laser according to any claim 1, wherein
the substrate is composed of a group III nitride semiconductor,
the main surface of the substrate is inclined at an angle of 1° or more with respect to a c-plane of the group III nitride semiconductor, and
the main surface of the substrate is inclined at an angle of 50° or less with respect to the c-plane of the group III nitride semiconductor.

18. The group III nitride semiconductor laser according to claim 17, wherein the main surface is inclined in a direction of an a-axis of the group III nitride semiconductor.

19. The group III nitride semiconductor laser according to claim 1, wherein the substrate is composed of GaN.

20. The group III nitride semiconductor laser according to claim 1, wherein the substrate is composed of InGaN.

* * * * *